(12) United States Patent
Kim

(10) Patent No.: US 12,113,049 B2
(45) Date of Patent: Oct. 8, 2024

(54) SEMICONDUCTOR PACKAGE AND METHOD OF MANUFACTURING SEMICONDUCTOR PACKAGE

(71) Applicant: Samsung Electronics Co., Ltd., Suwon-si (KR)

(72) Inventor: Chulwoo Kim, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/490,172

(22) Filed: Oct. 19, 2023

(65) Prior Publication Data

US 2024/0047421 A1 Feb. 8, 2024

Related U.S. Application Data

(63) Continuation of application No. 17/536,547, filed on Nov. 29, 2021, now Pat. No. 11,855,041.

(30) Foreign Application Priority Data

May 6, 2021 (KR) .................. 10-2021-0058376

(51) Int. Cl.
*H01L 25/065* (2023.01)
*H01L 23/00* (2006.01)
(Continued)

(52) U.S. Cl.
CPC ...... *H01L 25/0655* (2013.01); *H01L 23/3128* (2013.01); *H01L 23/49816* (2013.01); *H01L 23/49822* (2013.01); *H01L 24/16* (2013.01); *H01L 24/32* (2013.01); *H01L 24/73* (2013.01); *H01L 2224/16227* (2013.01); *H01L 2224/32225* (2013.01); *H01L 2224/73204* (2013.01); *H01L 2924/3511* (2013.01)

(58) Field of Classification Search
CPC ............ H01L 25/0655; H01L 23/3128; H01L 23/49816
See application file for complete search history.

(56) References Cited

U.S. PATENT DOCUMENTS 5,818,113 A 10/1998 Iseki et al.
6,677,677 B2 1/2004 Kimura et al.
(Continued)

FOREIGN PATENT DOCUMENTS

KR 100780869 B1 11/2007

*Primary Examiner* — Errol V Fernandes
(74) *Attorney, Agent, or Firm* — HARNESS, DICKEY & PIERCE, P.L.C.

(57) ABSTRACT

A semiconductor package includes a package substrate, an interposer on the package substrate, semiconductor devices in individual mounting regions on a first surface of the interposer, respectively, first conductive connection members, and a molding member on the interposer. The interposer has first bonding pads in the individual mounting regions, respectively. The semiconductor devices each have chip pads electrically connected to the first bonding pads. The first conductive connection members are between the first bonding pads and the chip pads. The molding member covers the semiconductor devices and fills gaps between the first surface of the interposer and the semiconductor devices. At least one of the individual mounting regions includes a pad-free region with a cross shape and pad regions defined by the pad-free region, and the first bonding pads are in the pad regions.

20 Claims, 19 Drawing Sheets

(51) Int. Cl.
*H01L 23/31* (2006.01)
*H01L 23/498* (2006.01)

(56) References Cited

U.S. PATENT DOCUMENTS

| | | |
|---|---|---|
| 7,223,681 B2 | 5/2007 | Hussa |
| 7,268,067 B2 | 9/2007 | Hall et al. |
| 8,796,847 B2 | 8/2014 | Lee |
| 9,257,412 B2 | 2/2016 | Chuang et al. |
| 9,589,092 B2 | 3/2017 | Fang et al. |
| 9,859,204 B2 | 1/2018 | Park et al. |
| 10,847,476 B2 | 11/2020 | Myung et al. |
| 2004/0227233 A1 | 11/2004 | Hussa |
| 2007/0165388 A1 | 7/2007 | Hussa |
| 2008/0277802 A1 | 11/2008 | Tsai et al. |
| 2017/0373029 A1 | 12/2017 | Seol et al. |
| 2019/0115312 A1 | 4/2019 | Huang et al. |
| 2022/0302064 A1 | 9/2022 | Chen et al. |

SEMICONDUCTOR PACKAGE AND METHOD OF MANUFACTURING SEMICONDUCTOR PACKAGE

PRIORITY STATEMENT

This application is a continuation application of U.S. application Ser. No. 17/536,547, filed Nov. 29, 2021, which claims priority under 35 U.S.C. § 119 to Korean Patent Application No. 10-2021-0058376, filed on May 6, 2021 in the Korean Intellectual Property Office (KIPO), the entire contents of each of which are herein incorporated by reference in their entirety.

BACKGROUND

1. Field

Example embodiments relate to a semiconductor package and/or a method of manufacturing the semiconductor package. More particularly, example embodiments relate to a semiconductor package including a plurality of different chips stacked on a package substrate using an interposer and/or a method of manufacturing the same.

2. Description of the Related Art 2.5D package products may provide high-density interconnection using an extra substrate such as a silicon interposer. Different types of semiconductor devices may be disposed on the silicon interposer and then may be molded by a molding material. However, when the molding material is formed by a wafer-level molding process, fluidity of the molding material between the interposer and the semiconductor device may be lowered, so that the molding material is cured before completely filling a gap therebetween, resulting in voids therebetween.

SUMMARY

Example embodiments provide a semiconductor package including a structure capable of improving process productivity and/or package reliability.

Example embodiments provide a method of manufacturing the semiconductor package.

According to example embodiments, a semiconductor package includes a package substrate; an interposer on the package substrate, the interposer including individual mounting regions on a first surface thereof and a plurality of first bonding pads in the individual mounting regions, respectively; a plurality of semiconductor devices in the individual mounting regions on the first surface of the interposer, respectively, the plurality of semiconductor devices each having chip pads electrically connected to the plurality of first bonding pads; first conductive connection members between the plurality of first bonding pads and the chip pads; and a molding member on the interposer. The molding member covers the plurality of semiconductor devices and fills gaps between the first surface of the interposer and the plurality of semiconductor devices. At least one of the individual mounting regions includes a pad-free region with a cross shape and a plurality of pad regions defined by the pad-free region, and the plurality of first bonding pads in the plurality of pad regions.

According to example embodiments, a semiconductor package includes a package substrate; an interposer on the package substrate, the interposer including a plurality of first bonding pads on a first surface of the interposer and a plurality of second bonding pads on a second surface of the interposer, the first surface of the interposer and the second surface of the interposer being opposite each other, the plurality of first bonding pads being in individual mounting regions on the first surface of the interposer, respectively; a plurality of semiconductor devices in the individual mounting regions on the first surface of the interposer, respectively, each of the plurality of semiconductor devices having chip pads electrically connected to the plurality of first bonding pads by a plurality of first conductive connection members; and a molding member on the first surface of the interposer. The molding member covers the plurality of semiconductor devices and fills gaps between the first surface of the interposer and the plurality of semiconductor devices. At least one of the individual mounting regions includes a pad-free region. The pad-free region has a transverse passage portion and a longitudinal passage portion crossing each other and a plurality of pad regions defined by the pad-free region. The plurality of first bonding pads are arranged in the pad regions, and the plurality of first bonding pads are not arranged in the pad-free region. A width of pad-free region is at least three times a pitch between the plurality of first bonding pads.

According to example embodiments, a semiconductor package includes a package substrate including substrate pads; an interposer on the package substrate, the interposer having a plurality of first bonding pads on a first surface of the interposer and a plurality of second bonding pads on a second surface of the interposer, the first surface of the interposer and the second surface of the interposer being opposite each other, the plurality of first bonding pads being in individual mounting regions on the first surface of interposer, respectively; a plurality of semiconductor devices in the individual mounting regions on the first surface of the interposer, respectively, each of the plurality of semiconductor devices having chip pads electrically connected to the plurality of first bonding pads by a plurality of first conductive connection members; a molding member on the first surface of the interposer, the molding member covering the plurality of semiconductor devices and filling gaps between the first surface of the interposer and the plurality of semiconductor devices; a plurality of second conductive connection members between the plurality of second bonding pads of the interposer and the substrate pads of the package substrate; and an underfill member between the interposer and the package substrate. At least one of the individual mounting regions includes a pad-free region. The pad-free region has a transverse passage portion and a longitudinal passage portion crossing each other and a plurality of pad regions defined by the pad-free region. The first bonding pads are in the plurality of pad regions. The first bonding pads are not arranged in the pad-free region. A width of the pad-free region is at least three times a pitch between the plurality of first bonding pads. The at least one of the individual mounting regions has an area of 11 mm×11 mm or more.

According to example embodiments, a semiconductor package may include a package substrate, an interposer on the package substrate, first and second semiconductor devices on the interposer to be spaced apart from each other, a plurality of first conductive connection members between the interposer and the first and second semiconductor devices, and a molding member on the interposer to cover side surfaces of the first and second semiconductor devices and to completely fill gaps between the interposer and the first and second semiconductor devices.

A first individual mounting region of the interposer on which the first semiconductor device having a relatively large area is mounted may include a pad-free region having the cross-shaped structure. Since pads are not arranged in the pad-free region, a space above the pad-free region may serve as an injection passage for a molding hardening material during a molding compression process in a wafer level for forming the molding member.

Accordingly, the small space between the interposer and the first semiconductor device may be effectively filled with the molding member through the pad-free region, to thereby limit and/or prevent a void from occurring in a central region of the first individual mounting region under the first semiconductor device. Further, separate processes of forming underfill members between the first and second semiconductor devices and the interposer may be omitted. Thus, process productivity for the molded interposer may be improved and 2.5D package reliability may be improved.

BRIEF DESCRIPTION OF THE DRAWINGS

Example embodiments will be more clearly understood from the following detailed description taken in conjunction with the accompanying drawings.

FIG. 1 is a plan view illustrating a semiconductor package in accordance with example embodiments.

FIG. 2 is a cross-sectional view taken along the line A-A' in FIG. 1.

FIG. 3 is an enlarged plan view illustrating portion 'A' in FIG. 1.

FIGS. 4 to 15 are views illustrating a method of manufacturing a semiconductor package in accordance with example embodiments.

FIG. 16 is a plan view illustrating a semiconductor package in accordance with example embodiments.

FIG. 17 is an enlarged plan view illustrating portion 'E' in FIG. 16.

FIG. 18 is a plan view illustrating a first individual mounting region of an interposer in accordance with example embodiments.

FIG. 19 is a plan view illustrating a first individual mounting region of an interposer in accordance with example embodiments.

FIG. 20 is a plan view illustrating a first individual mounting region of an interposer in accordance with example embodiments.

FIG. 21 is a plan view illustrating a first individual mounting region of an interposer in accordance with example embodiments.

DETAILED DESCRIPTION OF EXAMPLE EMBODIMENTS

Hereinafter, example embodiments will be explained in detail with reference to the accompanying drawings.

Figure 1:
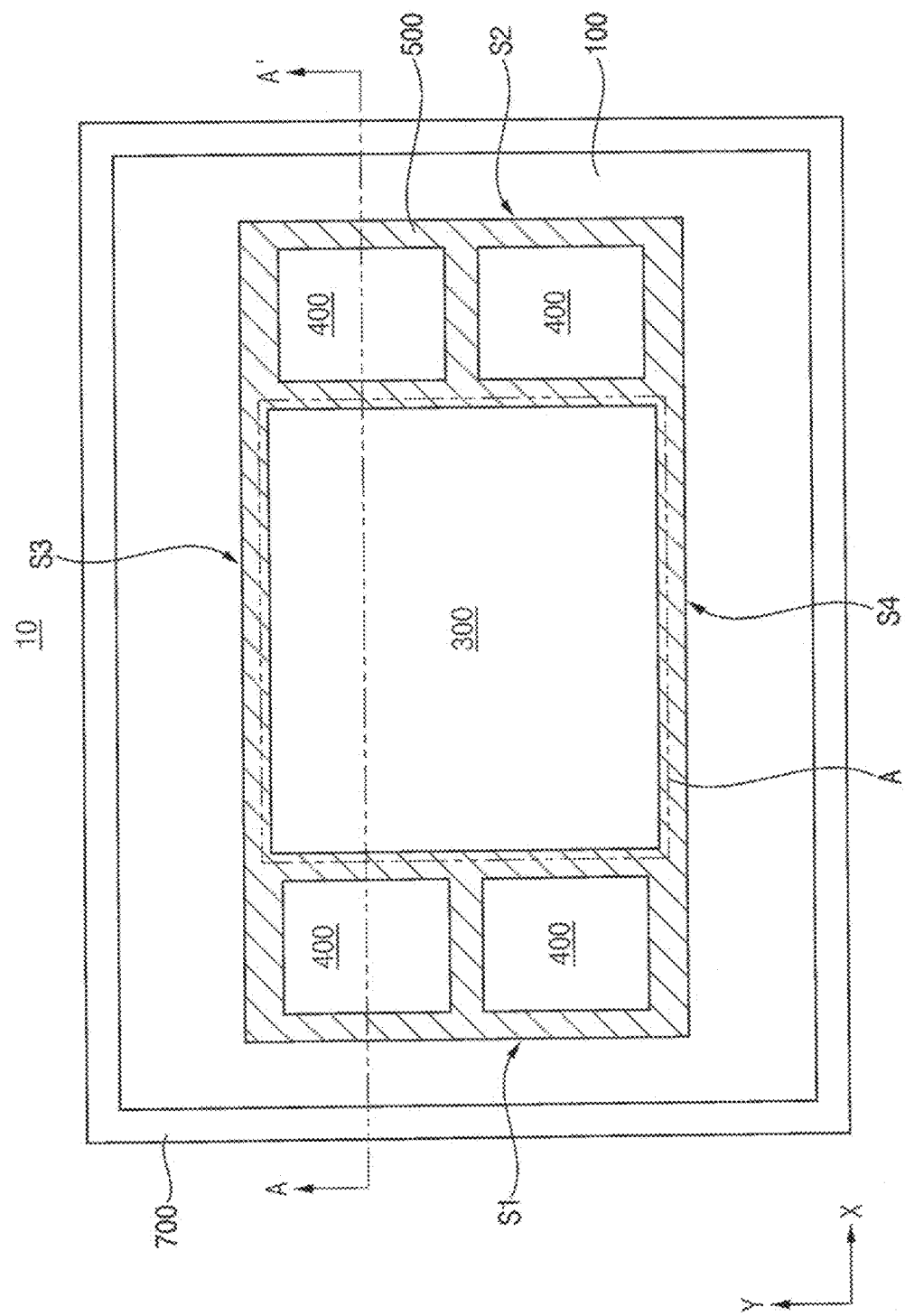
FIGS. 1 to 21 represent non-limiting, example embodiments as described herein.
Figure 2:
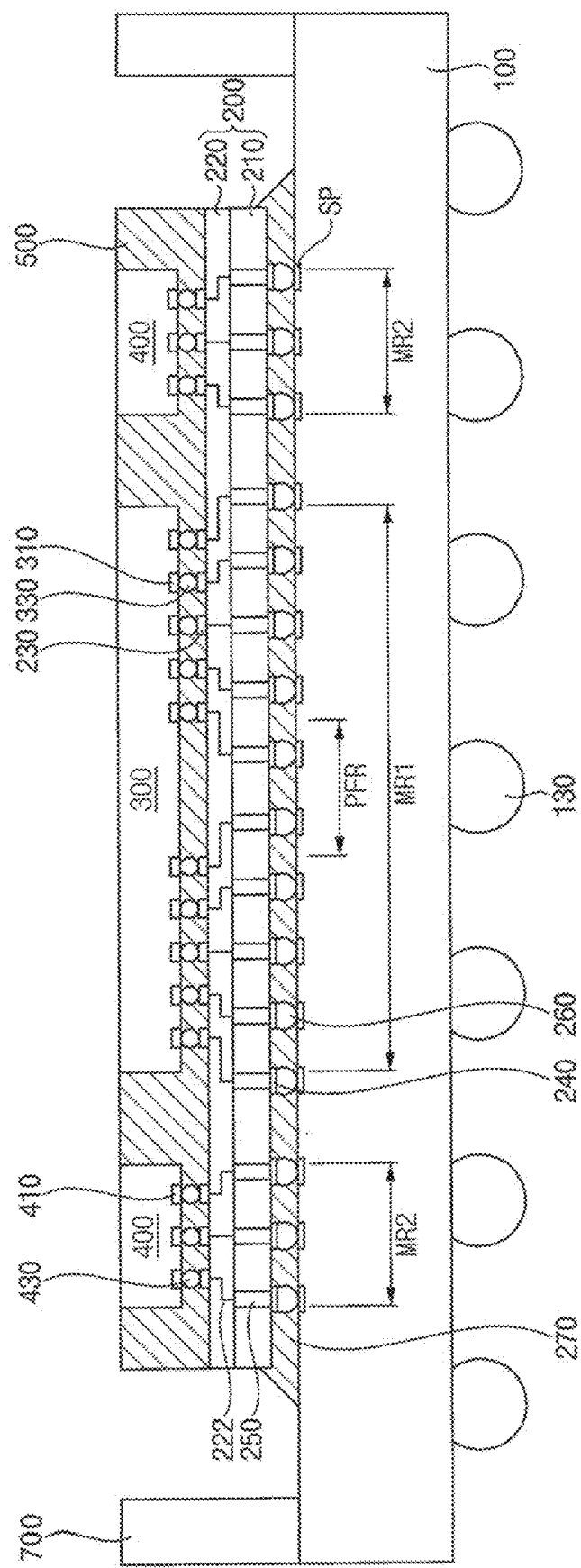
Figure 3:
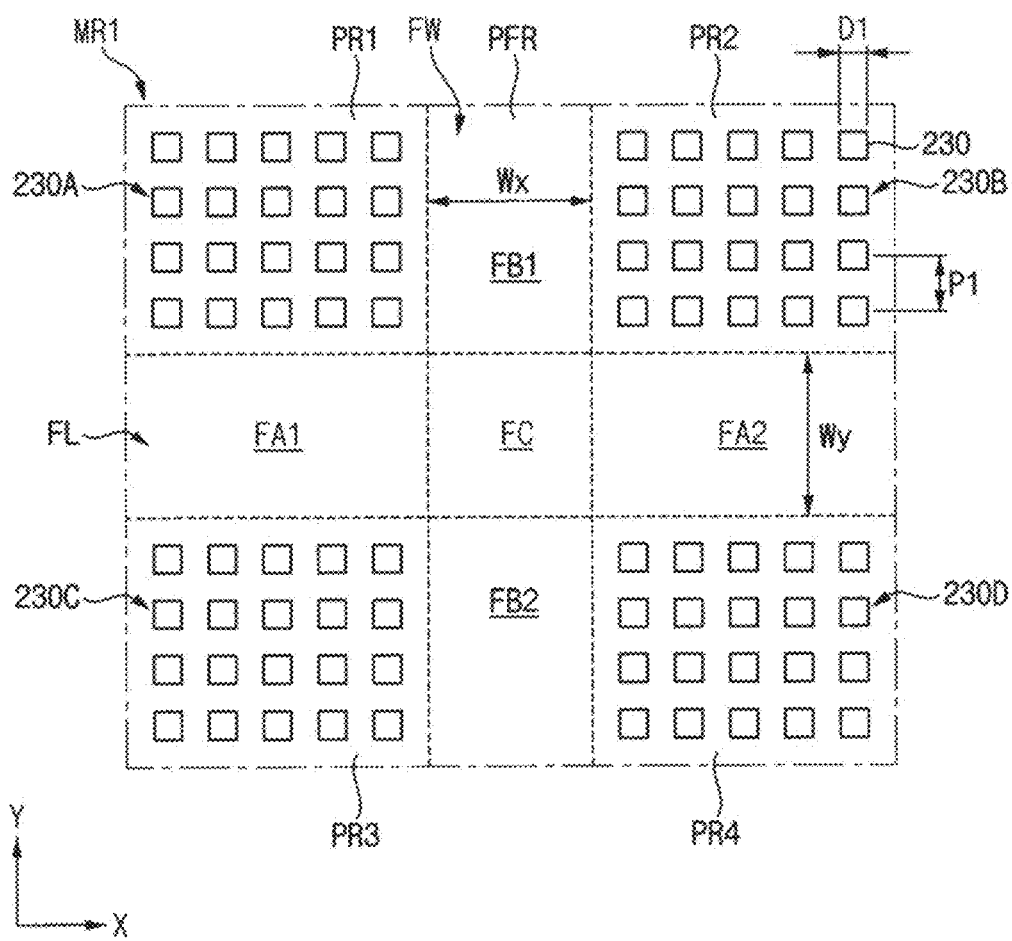

FIG. 1 is a plan view illustrating a semiconductor package in accordance with example embodiments. FIG. 2 is a cross-sectional view taken along the line A-A' in FIG. 1. FIG. 3 is an enlarged plan view illustrating portion 'A' in FIG. 1. FIG. 3 is a plan view illustrating an arrangement of first bonding pads in a first individual mounting region of an interposer in FIG. 1.

Referring to FIGS. 1 to 3, a semiconductor package 10 may include a package substrate 100, an interposer 200, first and second semiconductor devices 300, 400, first conductive connection members 330, 430 and a molding member 500.

Additionally, the semiconductor package 10 may further include second conductive connection members 260, an underfill member 270 and a stiffener 700.

In example embodiments, the semiconductor package 10 may be a memory device having a stacked chip structure in which a plurality of dies (chips) are stacked. For example, the semiconductor package 10 may include a semiconductor memory device with a 2.5D chip structure. In this case, the first semiconductor device 300 may include a logic semiconductor device, and the second semiconductor device 400 may include a memory device. The logic semiconductor device may include a CPU, a GPU, an ASIC, or an SOC. The memory device may include a high bandwidth memory (HBM) device.

In example embodiments, the package substrate 100 may be a substrate having an upper surface and a lower surface opposite to each other. For example, the package substrate 100 may be a printed circuit board (PCB). The PCB may be a multilayered circuit board including vias and various circuits therein. For example, the package substrate 100 may have an area of 55 mm×55 mm or more.

The interposer 200 may be disposed on the package substrate 100. The interposer 200 may be mounted on the package substrate 100 through solder bumps 260 as the second conductive connection members. A planar area of the interposer 200 may be less than a planar area of the package substrate 100. The interposer 200 may be disposed within the package substrate 100 in plan view.

The interposer 200 may have a first side surface S1 and a second side surface S2 extending parallel with a second direction (Y direction) that is perpendicular to a first direction (X direction) perpendicular to an upper surface thereof and opposite to each other, and a third side surface S3 and a fourth side surface S4 extending parallel with the first direction (X direction) and opposite to each other. The interposer 200 may have a rectangular plate shape having first sides (short sides) S1 and S2 and second sides (long sides) S3 and S4.

The interposer 200 may be a silicon interposer including a plurality of wirings therein. The first semiconductor device 300 and the second semiconductor devices 400 may be connected to each other through the wirings and may be electrically connected to the package substrate 100 through the solder bumps 260. The silicon interposer may provide a high density interconnection between the first and second semiconductor devices 300 and 400. Alternatively, the interposer 200 may be a redistribution wiring interposer or a semiconductor die in which a logic chip or a memory chip is implemented.

In case of the silicon interposer, the interposer 200 may include a semiconductor substrate 210, a wiring layer 220 on an upper surface of the semiconductor substrate 210 and including a plurality of wirings 222, a plurality of first bonding pads 230 provided on the wiring layer 220 and a plurality of second bonding pads 240 provided on a lower surface of the semiconductor substrate 210.

For example, the interposer 200 may have an area of 20 mm×30 mm or more. The substrate 210 may include silicon, germanium, silicon-germanium, or III-V compounds, e.g., GaP, GaAs, GaSb, etc.

The wiring layer 220 may include a plurality of insulation layers and a plurality of wirings 222 in the insulation layers. For example, the wirings may include a metal such as copper Cu.

The semiconductor substrate 210 may include a plurality of through electrodes 250 penetrating therethrough. The through electrode 250 may include a through silicon via (TSV). The through electrode 250 may be provided to extend in a thickness direction from a first surface of the semiconductor substrate 210. An end portion of the through electrode 250 may contact the wiring 222 of the wiring layer 220.

The interposer 200 may be mounted on the package substrate 100 via the solder bumps 260. The solder bump 260 may be formed on the second bonding pad 240. For example, the solder bump 260 may include C4 bump. The second bonding pad 240 of the interposer 200 may be electrically connected to a substrate pad SP of the package substrate 100 by the solder bump 260.

The first and second bonding pads 230, 240 may have a circular shape or a polygonal shape such as a quadrangle, an octagon, or the like. A diameter D1 of the first bonding pad 230 may be within a range of 25 μm to 40 μm. A pitch P1 between the first bonding pads 230 may be within a range of 20 μm to 70 μm. A diameter of the second bonding pad 240 may be greater than the diameter D1 of the first bonding pad 230. A pitch between the second bonding pads 240 may be greater than the pitch P1 between the first bonding pads 230.

As illustrated in FIGS. 2 and 3, a plurality of individual mounting regions MR1, MR2 in which a plurality of semiconductor devices are mounted respectively may be provided in the upper surface of the interposer 200. The individual mounting regions MR1, MR2 may have areas corresponding to areas of the mounted semiconductor devices. As described later, the first semiconductor device 300 may be mounted in the first individual mounting region MR1, and the second semiconductor devices 400 may be mounted in the second individual mounting regions MR2.

The first individual mounting region MR1 may have a larger area than the second individual mounting regions MR2. For example, the first individual mounting region MR1 may have an area of 11 mm×11 mm or more. A length of one side of the first individual mounting region MR1 may be within a range of 11 mm to 35 mm.

At least one individual mounting region of the individual mounting regions, for example, the first individual mounting region MR1 may include a pad-free region PFR and a plurality of pad regions PR1, PR2, PR3, PR4 defined by the pad-free region PFR.

The pad-free region PFR may have a cross-shaped structure. The pad-free region PFR may include at least one transverse passage portion FL extending in a first direction (X direction) and at least one longitudinal passage portion FW extending in a second direction (Y direction) to intersect with the transverse passage portion FL. The transverse passage portion FL and the longitudinal passage portion FW may have an intersection portion FC where they cross each other in a central region of the first individual mounting region MR1. The second direction may be perpendicular to the first direction. Alternatively, an angle between the first direction and the second direction may be within a range of 75 degrees to 85 degrees.

The transverse passage portion FL may include a first transverse extension portion FA1 extending from a first side portion of the first individual mounting region MR1 to the intersection portion FC and a second transverse extension portion FA2 extending from a second side portion opposite to the first side portion of the first individual mounting region MR1 to the intersection portion FC. Accordingly, the first transverse extension portion FA1, the intersection portion FC and the second transverse extension portion FA2 may constitute the transverse passage portion FL.

The longitudinal passage portion FW may include a first longitudinal extension portion FB1 extending from a third side portion of the first individual mounting region MR1 adjacent to the first side portion to the intersection portion FC and a second longitudinal extension portion FB2 extending from a fourth side portion opposite to the third side portion of the first individual mounting region MR1 to the intersection portion FC. Accordingly, the first longitudinal extension portion FB1, the intersection portion FC and the second longitudinal extension portion FB2 may constitute the longitudinal passage portion FL.

The transverse passage portion FL may have a first width Wy, and the longitudinal passage portion FW may have a second width Wx. The first width Wy and the second width Wx may be the same as or different from each other. The first width Wy and the second width Wx may be at least three times the pitch P1 between the first bonding pads 230. The first width Wy and the second width Wx may be three to ten times the pitch P1 between the first bonding pads 230. The first width Wy and the second width Wx may be within a range of 60 μm to 700 μm.

The first transverse extension portion FA1 and the first longitudinal extension portion FB1 may cross each other to form a right angle. The first transverse extension portion FA1 and the second longitudinal extension portion FB2 may cross each other to form a right angle. The second transverse extension portion FA2 and the first longitudinal extension portion FB1 may cross each other to form a right angle. The second transverse extension portion FA2 and the second longitudinal extension portion FB2 may cross each other to form a right angle.

The first individual mounting region MR1 may include first to fourth pad regions PR1, PR2, PR3, PR4 defined by the pad-free region PFR. The first bonding pads 230 may be arranged in the first to fourth pad regions PR1, PR2, PR3, PR4, but may not be arranged in the pad-free region PFR. A first group of the first bonding pads 230A may be arranged in an array in the first pad area PR1. A second group of the first bonding pads 230B may be arranged in an array in the second pad area PR2. A third group of the first bonding pads 230C may be arranged in an array in the third pad area PR3. A fourth group of the first bonding pads 230D may be arranged in an array in the fourth pad area PR4.

In example embodiments, at least one first semiconductor device 300 may be arranged on the first individual mounting region MR1 of the interposer 200. The first semiconductor device 300 may be mounted on the interposer 200 in a flip chip boding manner. In this case, the first semiconductor device 300 may be mounted such that an active surface of the first semiconductor device 300 on which chip pads 310 are formed faces the interposer 200. The chip pads 310 of the first semiconductor device 300 may be electrically connected to the first bonding pads 230 of the interposer 200, which are arranged in the first to fourth pad regions PR1, PR2, PR3, PR4 of the interposer 200, by conductive bumps 330 as the first conductive members. For example, the conductive bumps may include micro bump (uBump). Diameters D2 of the conductive bumps 330 may be within a range of 20 μm to 35 μm.

The second semiconductor devices 400 may be arranged on the second individual mounting regions MR2 of the interposer 200 to be spaced apart from the first semiconductor device 300. The second semiconductor devices 400 may be arranged on the interposer 200 to be spaced apart from each other. The second semiconductor devices 400 may be mounted on the interposer 200 in a flip chip boding manner. In this case, the second semiconductor device 400 may be mounted such that an active surface of the second semiconductor device 400 on which chip pads 410 are formed faces the interposer 200. The chip pads 410 of the second semiconductor device 400 may be electrically connected to the first bonding pads 230 of the interposer 200 by conductive bumps 430 as the first conductive connection members. For example, the conductive bumps 430 may include micro bump (uBump).

For example, the second semiconductor device 400 may include a buffer die and a plurality of memory dies (chips) sequentially stacked on the buffer die. Additionally, the second semiconductor device 400 may further include a molding member covering at least side surfaces of the buffer die and the memory dies. The buffer die and the memory dies may be electrically connected to each other by through silicon vias (TSVs).

The wirings 222 may be electrically connected to through electrodes 250. The first and second semiconductor devices 300, 400 may be electrically connected to the package substrate 100 through the wirings 222 and the through electrodes 250. The first semiconductor device 300 and the second semiconductor device 400 may be electrically connected to each other by the wirings 222.

One first semiconductor device 300 may be disposed in a central region of the interposer 200. Two second semiconductor devices 400 may be spaced apart from each other in the second direction (Y direction) along the first side surface S1 of the interposer 200. Two second semiconductor devices 400 may be spaced apart from each other in the second direction (Y direction) along the second side surface S2 of the interposer 200. Two second semiconductor devices 400 may be disposed in the left side of the first semiconductor device 300 adjacent to the first side surface S1 of the interposer 200, and two second semiconductor devices 400 may be disposed in the right side of the first semiconductor device 300 adjacent to the second side surface S2 of the interposer 200.

Although only one first semiconductor device 300 and four second semiconductor device 400 are illustrated in the figures, the numbers and arrangements thereof are non-limiting examples, and it may not be limited thereto.

In example embodiments, the molding member 500 may be provided on the upper surface of the interposer 200 to cover the first and second semiconductor devices 300, 400. The molding member 500 may cover the side surfaces of the first and second semiconductor devices 300, 400.

An upper surface of the molding member 500 may be coplanar with upper surfaces of the first and second semiconductor devices 300, 400. The upper surfaces of the first and second semiconductor devices 300, 400 may be exposed by the molding member 500. Aside surface of the molding member 500 may be coplanar with the side surface of the interposer 200.

For example, the molding member 500 may include a polymer material such as an epoxy molding compound (EMC). The molding member 500 may include fillers of 60 wt % or more of the total weight. The fillers may include silicon dioxide ($SiO_2$).

In example embodiments, the molding member 500 may be provided to completely fill gaps between the upper surface of the interposer 200 and the first and second semiconductor devices 300, 400. As described later, since pads are not formed in the pad-free region PFR of the first individual mounting region MR1, a space above the pad-free region PFR may serve as an injection passage for a molding hardening material during a molding compression process in a wafer level for forming the molding member 500.

Thus, the small space between the interposer 200 and the first semiconductor device 300 may be effectively filled with the molding member 500 through the pad-free region PFR, to thereby prevent a void from occurring in the central region of the first individual mounting region MR1 under the first semiconductor device 300.

In example embodiments, the underfill member 270 may be underfilled between the interposer 200 and the package substrate 100. The underfill member 270 may extend between the interposer 200 and the package substrate 100 to reinforce a gap between the interposer 200 and the package substrate 100. A portion of the underfill member 270 may extend upwardly from the upper surface of the package substrate 100 to cover a portion of a side surface of the interposer 200 to firmly support the interposer 200.

The underfill member may include a material having a relatively high fluidity to effectively fill small spaces between the interposer and the package substrate. For example, the underfill member may include an adhesive including an epoxy material.

In example embodiments, a stiffener 700 may be arranged on the package substrate 100 to surround the semiconductor devices 300, 400. The stiffener 700 may be provided to extend along a peripheral region of the package substrate 100 to increase overall rigidity of the package substrate 100 to thereby reduce or prevent warpage. Accordingly, reliability of the 2.5D package may be improved.

Outer connection pads may be formed on the lower surface of the package substrate 100, and outer connection members 130 for an electrical connection with an external device may be disposed on the outer connection pads respectively. The outer connection members 130 may be, for example, solder balls. The semiconductor package 10 may be mounted on a module substrate by the solder balls, thus constituting a memory module.

Although only some first bonding pads and second bonding pads are illustrated in the figures, it may be understood that the first bonding pads and the second bonding pads are non-limiting examples, and thus, it may not limited thereto.

As mentioned above, the semiconductor package 10 may include the package substrate 100, the interposer 200 provided on the package substrate 100, the first and second semiconductor devices 300, 400 arranged on the interposer 200 to be spaced apart from each other, and the molding member 500 on the interposer 200 to cover the side surfaces of the first and second semiconductor devices 300, 400 and completely filling the gaps between the interposer and the first and second semiconductor devices 300, 400.

The first individual mounting region MR1 of the interposer 200 in which the first semiconductor device 300 having a relatively large area is mounted may include the pad-free region PFR having the cross-shaped structure. Since pads are not arranged in the pad-free region PFR, a space above the pad-free region PFR may serve as an injection passage for the molding hardening material during the molding compression process in a wafer level for forming the molding member 500.

Accordingly, the small space between the interposer 200 and the first semiconductor device 300 may be effectively filled with the molding member 500 through the pad-free region PFR, to thereby prevent a void from occurring in the central region of the first individual mounting region MR1 under the first semiconductor device 300. Further, separate processes of forming underfill members between the first and second semiconductor devices 300, 400 and the interposer 200 may be omitted. Thus, process productivity for the molded interposer may be improved and 2.5D package reliability may be improved.

Hereinafter, a method of manufacturing the semiconductor package in FIG. 1 will be explained.

Figure 4:
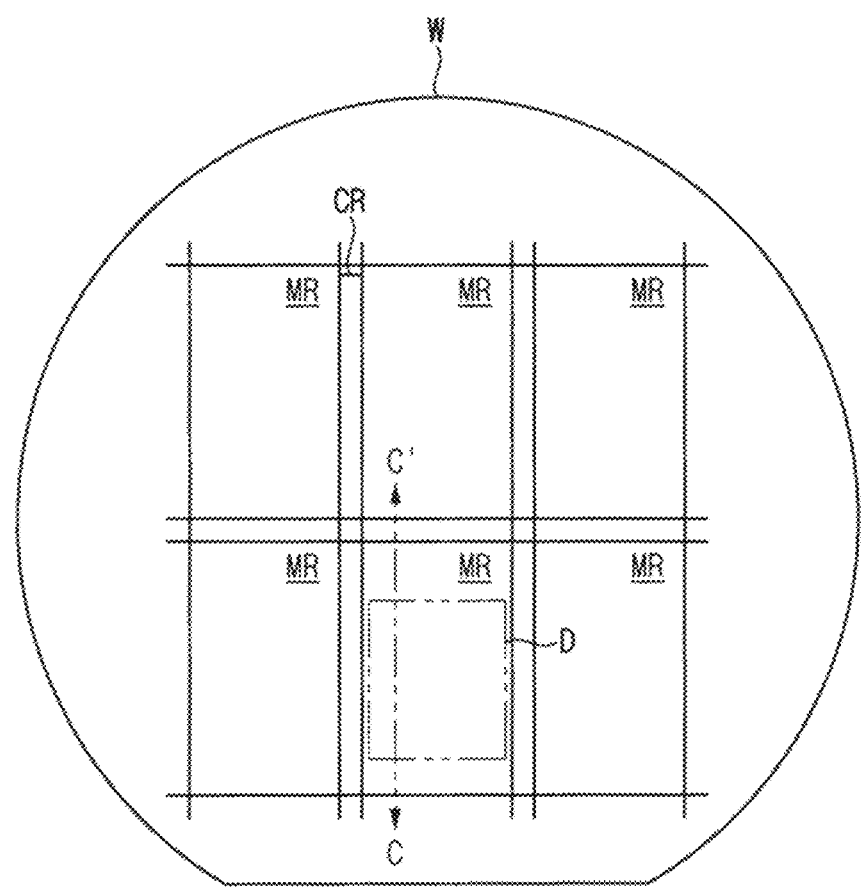
Figure 5:
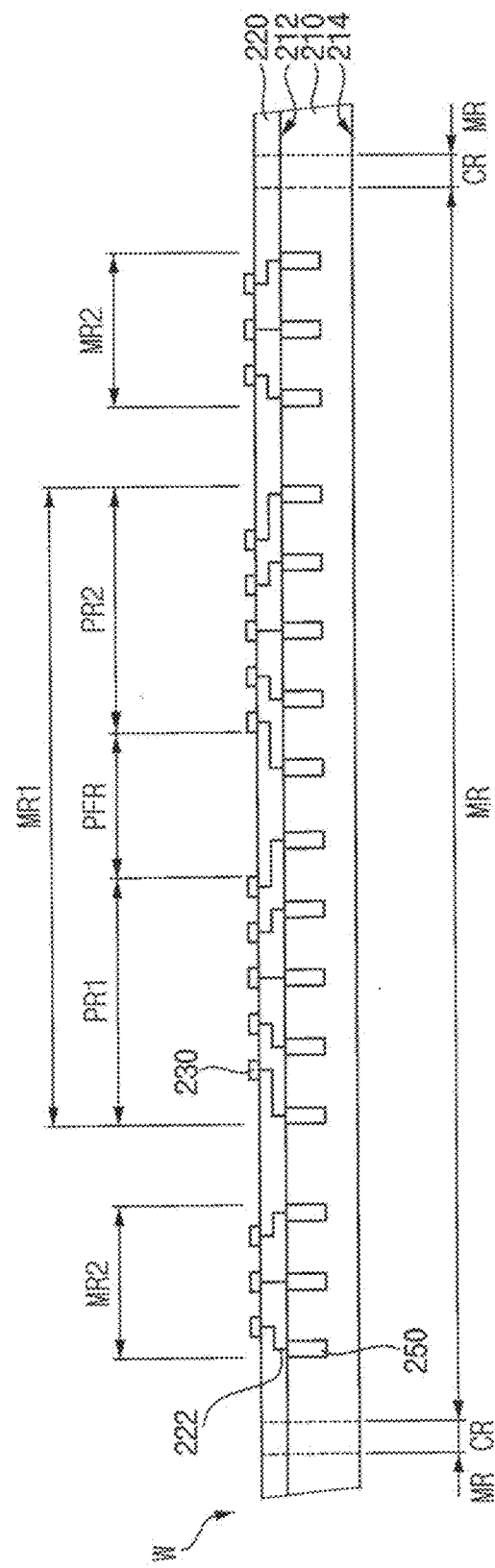
Figure 6:
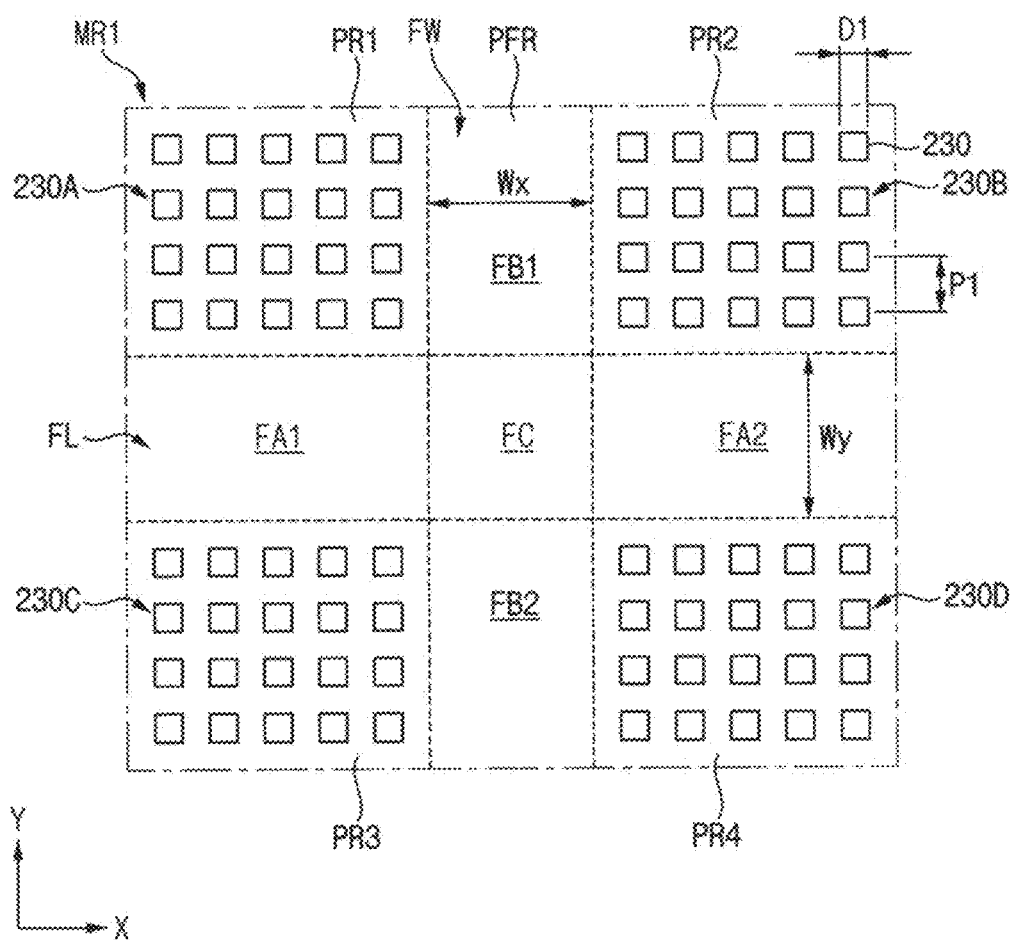
Figure 10:
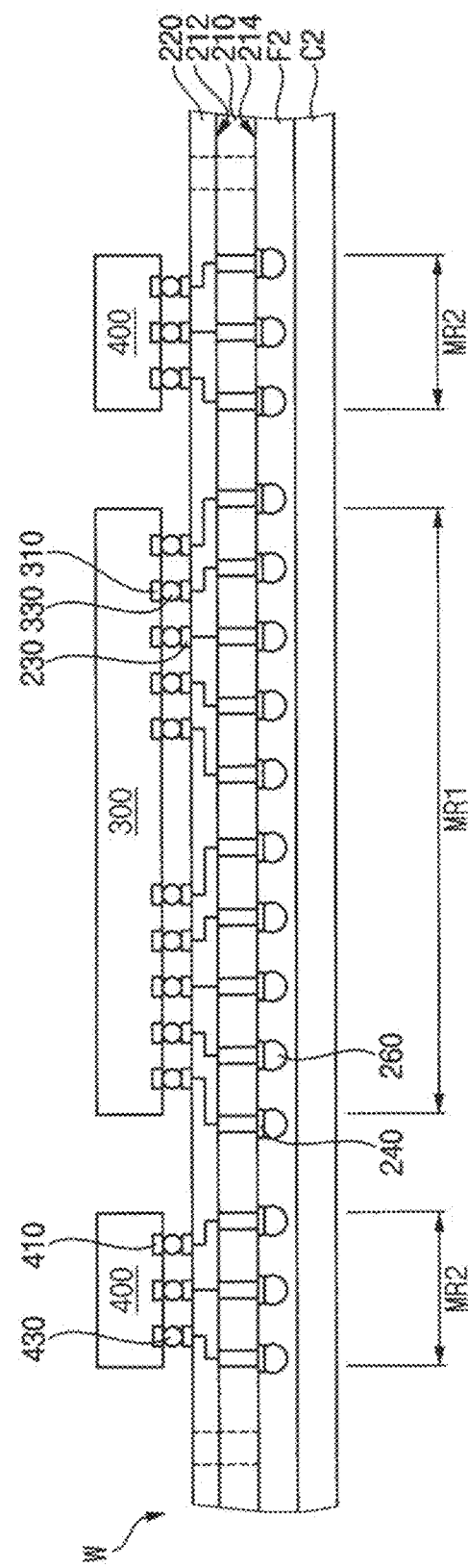
Figure 11:
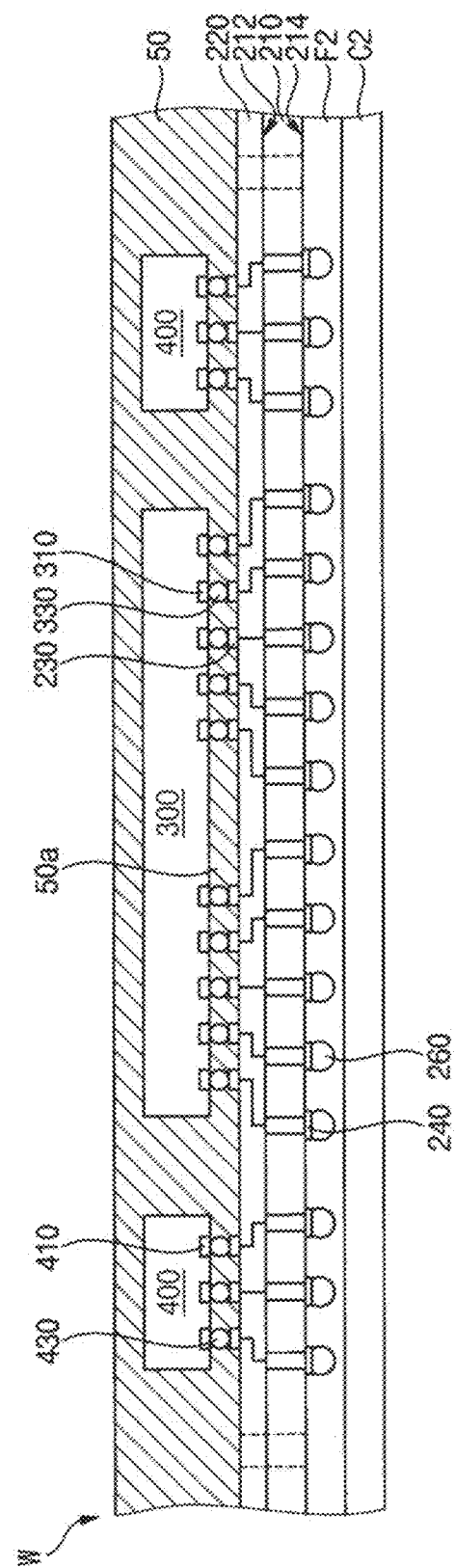
Figure 12:
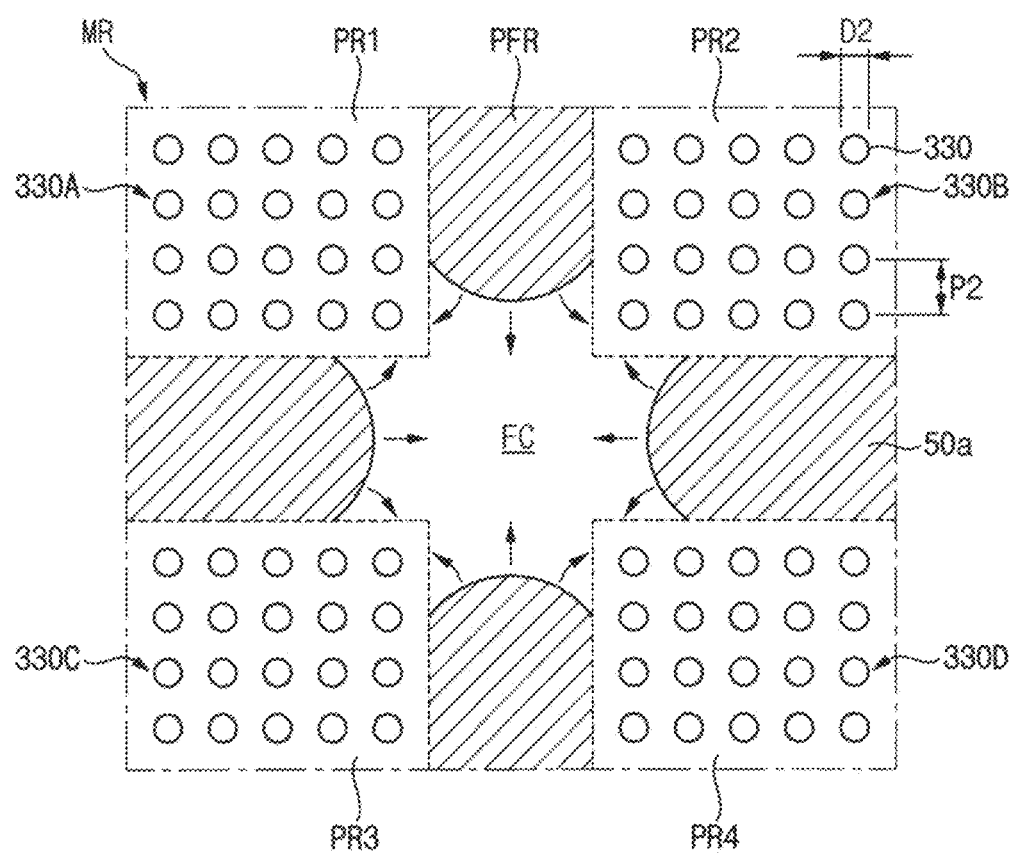

FIGS. 4 to 15 are views illustrating a method of manufacturing a semiconductor package in accordance with example embodiments. FIGS. 5, 7 to 11 and 13 to 15 are cross-sectional views taken along the line C-C' in FIG. 4. FIGS. 6 and 12 are enlarged plan views illustrating portion 'D' in FIG. 4. FIG. 6 is a plan view illustrating an arrangement of first bonding pads in FIG. 5, and FIG. 12 is a plan view illustrating an arrangement of conductive bumps in FIG. 11.

Referring to FIGS. 4 to 6, first, a semiconductor wafer W for a base structure may be prepared.

In example embodiments, the base structure may include a silicon interposer. Alternatively, the base structure may include a redistribution wiring interposer or a semiconductor die in which a logic chip or a memory chip is implemented.

In case of the silicon interposer, the wafer W may include a substrate 210 and a wiring layer 220. The wiring layer 220 may be provided on a first surface 212 of the substrate 210. The wafer W may include a package region, i.e., a mounting region MR where semiconductor device(s) are mounted and a scribe lane region, i.e., a cutting region CA surrounding the mounting region MR. As described later, the wafer W may be cut along the cutting region CA dividing the mounting regions MR to form an individual interposer. For example, the mounting region MR may have an area of 20 mm×30 mm or more. A length of one side of the mounting region MR may be within a range of 30 mm to 60 mm.

For example, the substrate 210 may include silicon, germanium, silicon-germanium, or III-V compounds, e.g., GaP, GaAs, GaSb, etc. In some embodiments, the substrate 210 may be a silicon-on-insulator (SOI) substrate, or a germanium-on-insulator (GOI) substrate.

The wiring layer 220 may be formed on the first surface 212 of the substrate 210. The wiring layer 220 may be formed by a back process referred to as BEOL (Back End of Line) process. The wiring layer 220 may include a plurality of insulation layers and a plurality of wirings 222 in the insulation layers. For example, the wiring may include a metal such as copper (Cu).

The substrate 210 may include a plurality of through electrodes (through silicon vias) 250 which are formed to penetrate through the substrate. The through electrodes 250 may be electrically connected to the wirings 222 respectively. The through electrode may be formed before grinding a backside of the substrate 210, that is, a second surface 214 (via first, via middle process). Alternatively, the through electrode may be formed after grinding the backside of the substrate 210 (via last process)

A first bonding pad 230 may be provided in the outermost insulation layer of the wiring layer 220. The through electrode 250 may be electrically connected to the first bonding pad 230 through the wiring 222. The first bonding pad 230 may have a circular shape or a polygonal shape such as a quadrangle, an octagon, or the like. A diameter D1 of the first bonding pad 230 may be within a range of 25 μm to 40 μm. A pitch P1 between the first bonding pads 230 may be within a range of 20 μm to 70 μm.

As illustrated in FIGS. 5 and 6, the mounting region MR may include a plurality of individual mounting regions MR1, MR2 in which a plurality of semiconductor devices is mounted respectively. The individual mounting regions MR1, MR2 may be arranged to be spaced apart from each other. As will be described later, a first semiconductor device 300 may be mounted in the first individual mounting region MR1, and a second semiconductor devices 400 may be mounted in the second individual mounting regions MR2.

The first individual mounting region MR1 may have a larger area than the second individual mounting regions MR2. For example, the first individual mounting region MR1 may have an area of 11 mm×11 mm or more. A length of one side of the first individual mounting region MR1 may be within a range of 11 mm to 35 mm.

At least one individual mounting region of the individual mounting regions, for example, the first individual mounting region MR1 may include a pad-free region PFR and a plurality of pad regions PR1, PR2, PR3, PR4 defined by the pad-free region PFR.

The pad-free region PFR may have a cross-shaped structure. The pad-free region PRR may include at least one transverse passage portion FL extending in a first direction and at least one longitudinal passage portion FW extending in a second direction to intersect with the transverse passage portion FL. The transverse passage portion FL and the longitudinal passage portion FW may have an intersection portion FC where they cross each other in a central region of the first individual mounting region MR1. The second direction may be perpendicular to the first direction. Alternatively, an angle between the first direction and the second direction may be within a range of 75 degrees to 85 degrees.

The transverse passage portion FL may include a first transverse extension portion FA1 extending from a first side portion of the first individual mounting region MR1 to the intersection portion FC and a second transverse extension portion FA2 extending from a second side portion opposite to the first side portion of the first individual mounting region MR1 to the intersection portion FC. Accordingly, the first transverse extension portion FA1, the intersection portion FC and the second transverse extension portion FA2 may constitute the transverse passage portion FL.

The longitudinal passage portion FW may include a first longitudinal extension portion FB1 extending from a third side portion of the first individual mounting region MR1 to the intersection portion FC and a second longitudinal extension portion FB2 extending from a fourth side portion opposite to the third side portion of the first individual mounting region MR1 to the intersection portion FC. Accordingly, the first longitudinal extension portion FB1, the intersection portion FC and the second longitudinal extension portion FB2 may constitute the longitudinal passage portion FL.

The transverse passage portion FL may have a first width Wy, and the longitudinal passage portion FW may have a second width Wx. The first width Wy and the second width Wx may be the same as or different from each other. The first width Wy and the second width Wx may be at least three times the pitch P1 between the first bonding pads 230. The first width Wy and the second width Wx may be three to ten times the pitch P1 between the first bonding pads 230. The first width Wy and the second width Wx may be within a range of 60 μm to 700 μm.

The first transverse extension portion FA1 and the first longitudinal extension portion FB1 may cross each other to form a right angle. The first transverse extension portion FA1 and the second longitudinal extension portion FB2 may cross each other to form a right angle. The second transverse extension portion FA2 and the first longitudinal extension portion FB1 may cross each other to form a right angle. The second transverse extension portion FA2 and the second longitudinal extension portion FB2 may cross each other to form a right angle.

The first individual mounting region MR1 may include first to fourth pad regions PR1, PR2, PR3, PR4 defined by the pad-free region PFR. The first bonding pads 230 may be arranged in the first to fourth pad regions PR1, PR2, PR3, PR4, but may not be arranged in the pad-free region PFR. A first group of the first bonding pads 230A may be arranged in an array in the first pad area PR1. A second group of the first bonding pads 230B may be arranged in an array in the second pad area PR2. A third group of the first bonding pads 230C may be arranged in an array in the third pad area PR3. A fourth group of the first bonding pads 230D may be arranged in an array in the fourth pad area PR4.

Figure 7:
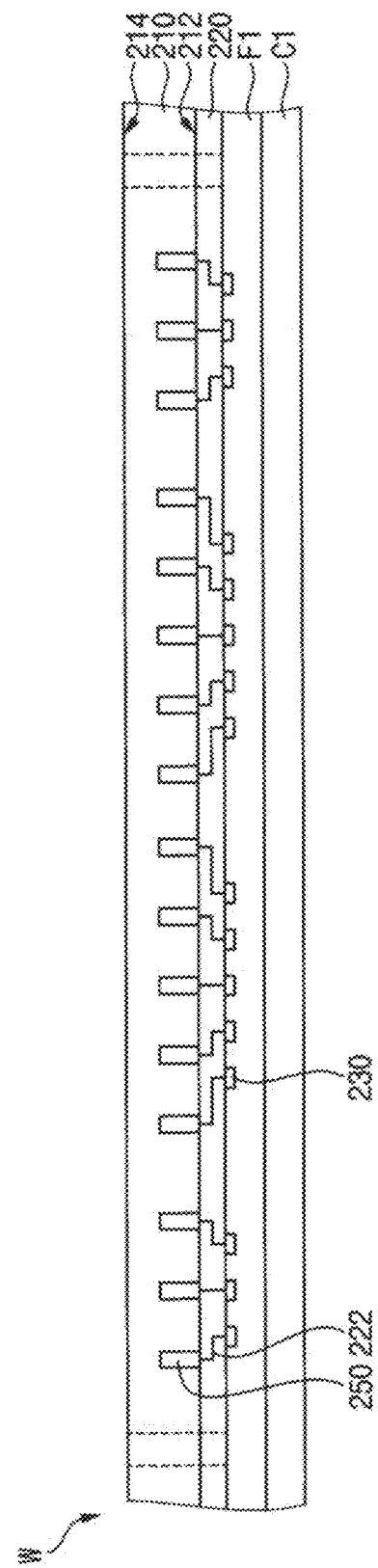
Figure 8:
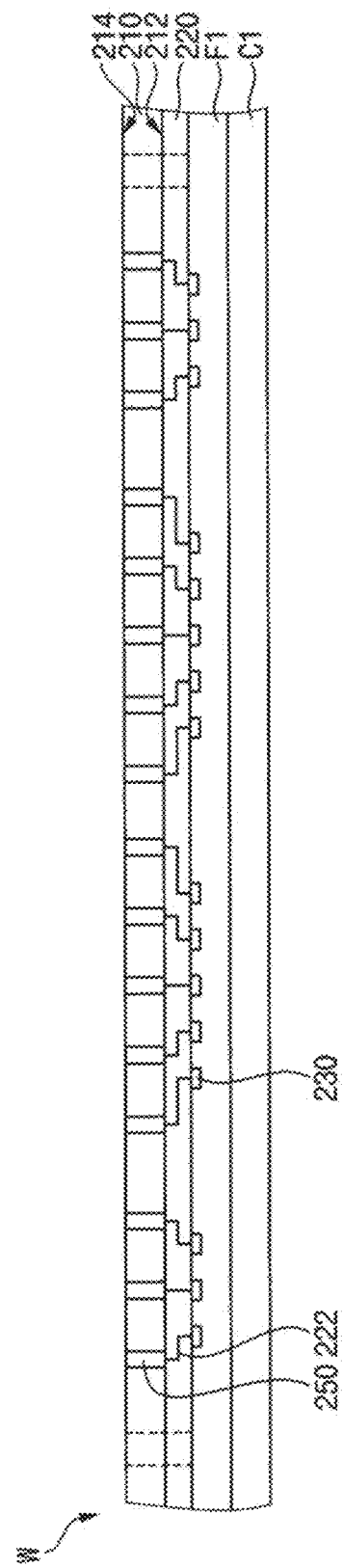
Figure 9:
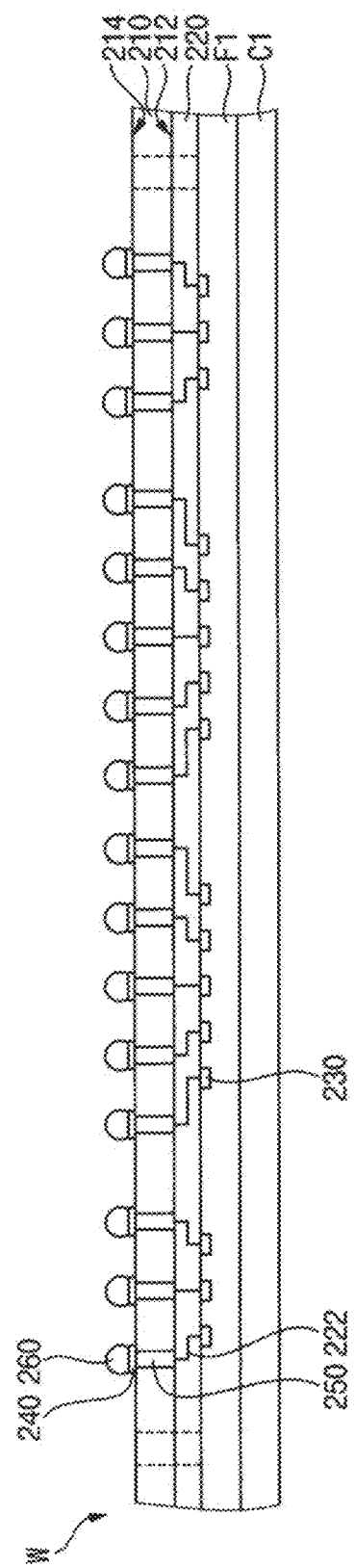

Referring to FIGS. 7 to 9, a second bonding pad 240 may be formed on the second surface 214 of the substrate 210, and a solder bump 260 as a conductive connection member may be formed on the second bonding pad 240.

As illustrated in FIGS. 7 and 8, the backside of the substrate 210, that is, the second surface 214 may be grinded using a substrate support system WSS. The wafer W may be adhered on a carrier substrate C1 using a first adhesive film F1, and then, the second surface 214 of the substrate 210 may be grinded until a portion of the through electrode 250 is exposed.

The second surface 214 of the substrate 210 may be partially removed by a grinding process such as a chemical mechanical polishing (CMP) process. Thus, a thickness of the substrate 210 may be reduced to a desired thickness. For example, the substrate 210 may have a thickness range of about 50 μm to 100 μm. Additionally, the portion of the through electrode 250 may be exposed from the second surface 214 of the substrate 210.

As illustrated in FIG. 9, the second bonding pad 240 may be formed on the second surface 214 of the substrate 210 to be electrically connected to the through electrode 250, and the solder bump 260 may be formed on the second bonding pad 240.

The second bonding pad 240 may be formed by forming a seed layer and a photoresist layer on the second surface 214 of the substrate 210, performing an exposure process on the photoresist layer to form a photoresist pattern having an opening that exposes a portion of the seed layer, and performing a plating process on the exposed portion of the seed layer.

For example, the second bonding pad 240 may have a diameter of 70 μm to 80 μm. The diameter of the second bonding pad 240 may be at least three times a diameter of the first bonding pad 230.

Then, the solder bump 260 may be formed on the second bonding pad 240.

In particular, a seed layer may be formed on the second bonding pad 240 on the second surface 214 of the substrate 210, and a photoresist pattern having an opening that expose a portion of the seed layer may be formed on the second surface 214 of the substrate 210.

Then, the opening of the photoresist pattern may be filled with a conductive material, and then, the photoresist pattern may be removed and a reflow process may be performed to form the solder bump 260. For example, the conductive material may be formed by a plating process. Alternatively, the solder bump may be formed by a screen printing process, a deposition process, etc. For example, the solder bump 260 may include C4 bump.

The, the carrier substrate C1 may be removed from the wafer W.

Referring to FIG. 10, the structure in FIG. 9 may be reversed, and a plurality of semiconductor devices 300, 400 may be mounted on the wiring layer 220.

Firstly, the wafer W may be adhered on a second carrier substrate C2 using a second adhesive film F2. The wafer W may be adhered on the second carrier substrate C2 such that the second surface 214 faces toward the second carrier substrate C2 and the first bonding pads 230 are exposed. Then, the first and second semiconductor devices 300, 400 may be arranged on the wiring layer 220 to be spaced apart from each other. The first semiconductor device 300 may be mounted in the first individual mounting regions MR1, and the second semiconductor devices 400 may be mounted in the second individual mounting regions MR2, respectively.

In example embodiments, the first and second semiconductor devices may be mounted on the wiring layer 220 in a flip chip bonding manner. Chip pads 310 of the first semiconductor device 300 may be electrically connected to the first bonding pads 230 of the wiring layer 220 by conductive bumps 330. Chip pads 410 of the second semiconductor device 400 may be electrically connected to the first bonding pads 230 of the wiring layer 220 by conductive bumps 430. For example, the conductive bumps 330, 430 may include micro bump (uBump). Diameters D2 of the conductive bumps 330 and 430 may be within a range of 20 μm to 35 μm.

For example, the first semiconductor device may include a logic semiconductor device, and the second semiconductor device 400 may include a memory device. The logic semiconductor device may include a CPU, a GPU, an ASIC, or an SOC. The memory device may include a high bandwidth memory (HBM) device. In this case, the second semiconductor device may include a buffer die and a plurality of memory dies (chips) sequentially stacked on the buffer die. The buffer die and the memory dies may be electrically connected to each other by through silicon vias.

The first semiconductor device 300 may have an area of 15 mm×15 mm or more. A first height of the first semiconductor device 300 may be 500 μm or more. An area of the second semiconductor device 400 may be smaller than an area of the first semiconductor device 300.

Referring to FIGS. 11 and 12, a molding material 50 may be formed on the wiring layer 220 to cover side surfaces and upper surfaces of the first and second semiconductor devices 300, 400. The molding material 50 may be formed to completely fill gaps between the first and second semiconductor devices 300, 400. Additionally, the molding material 50 may be formed to completely fill gaps between the wiring layer 220 and the first and second semiconductor devices 300, 400.

For example, the molding material 50 may be formed on the wafer W by a compression molding process which is performed by a wafer level molding apparatus. The molding material 50 may be formed using a polymer material such as an epoxy molding compound (EMC). The molding material 50 may include fillers of 60 wt % or more of the total weight. The fillers may include silicon dioxide ($SiO_2$).

After the wafer W is loaded between an upper mold and a lower mold of the molding apparatus, the molding material 50 may be applied on the wafer W. Subsequently, a vacuum may be formed in the molding apparatus, and the upper mold and the lower mold may be coupled to each other to apply pressure to the molding material. The molding material has fluidity by the pressure and may move into small spaces between the wiring layer 220 and the first and second semiconductor devices 300 and 400 and between the conductive bumps 330 and 430.

As illustrated in FIG. 12, the first conductive connection members, that is, the conductive bumps 330 may be disposed respectively in the first to fourth pad regions PR1, PR2, PR3, PR4. A first group of conductive bumps 330A may be disposed respectively on the first bonding pads 230A of the first pad region PR1. A second group of conductive bumps 330B may be disposed respectively on the second bonding pads 230B of the second pad region PR2. A third group of conductive bumps 330C may be disposed respectively on the first bonding pads 230C of the third pad region PR3. A fourth group of conductive bumps 330D may be disposed respectively on the first bonding pads 230D of the fourth pad region PR4.

A portion of the molding material 50a may move into a small space between the wiring layer 220 and the first semiconductor device 300 through the first to fourth side portions of the first individual mounting region MR1. When the molding hardening material flows between the conductive bumps 330 under the first semiconductor device 300 having a relatively large area, if the molding hardening material solidifies before reaching the central region, the spaces in the central region may not be completely filled with the molding hardening material, so that voids may be generated.

In example embodiments, the portion of the molding material 50a may move relatively quickly to the central region of the first individual mounting region MR1 under the first semiconductor device 300 through the transverse passage portion FL and the longitudinal passage portion FW extending from the first to fourth side portions of the pad-free region PFR to the central region FC, and may move evenly and quickly into each pad region through peripheral regions of the first to fourth pad regions PR1, PR2, PR3, PR4. That is, the pad-free region PFR including the transverse passage portion FL and the longitudinal passage portion FW may serve as an injection passage for the molding material.

Accordingly, the pad-free region PFR may improve the fluidity of the molding material 50 under the first semiconductor device 300 to effectively fill the small space between the first semiconductor device 300 and the wiring layer 220 with the molding material. Thus, a void may be prevented from occurring in the central region of the first individual mounting region MR1 under the first semiconductor device 300. Further, separate processes of forming underfill members between the first and second semiconductor devices 300, 400 and the interposer 200 may be omitted.

Figure 13:
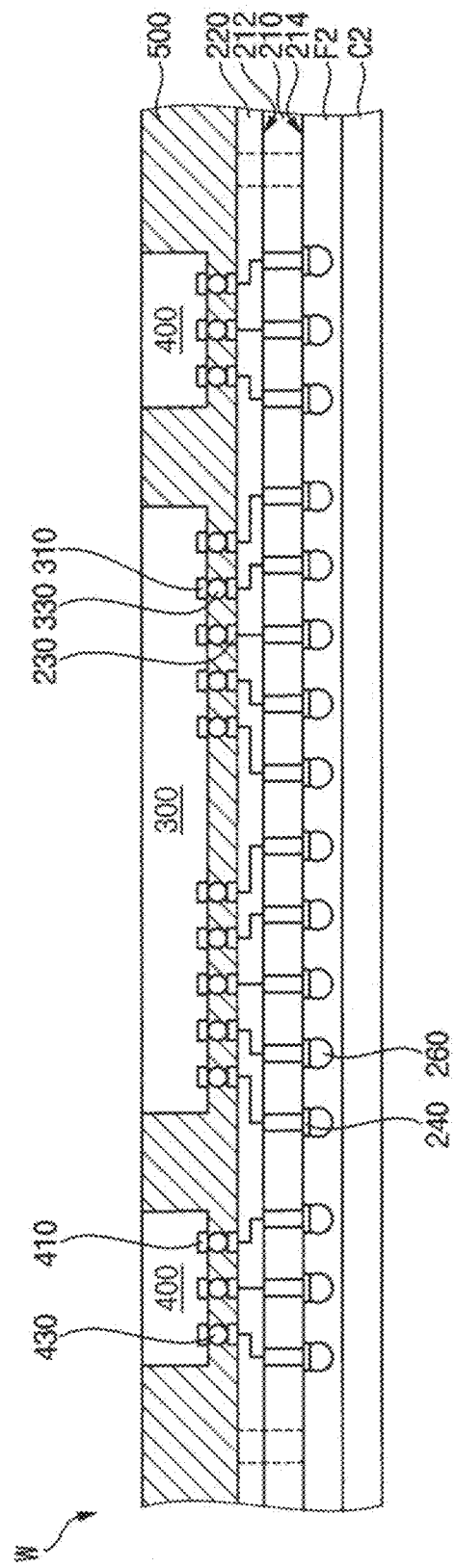

Referring to FIG. 13, an upper surface of the molding material 50 may be partially removed to form a molding member 500 that exposes the upper surfaces of the first and second semiconductor devices 300, 400.

For example, the molding material 50 may be partially removed by a grinding process such as a chemical mechanical polishing (CMP) process. The upper surfaces of the first and second semiconductor devices 300, 400 may be exposed by the molding member 500. The upper surface of the molding member 500 may be coplanar with the upper surface of the first semiconductor device 300 and/or the upper surface of the second semiconductor device 400. The side surfaces of the first and second semiconductor devices 300, 400 may be covered by the molding member 500.

Figure 14:
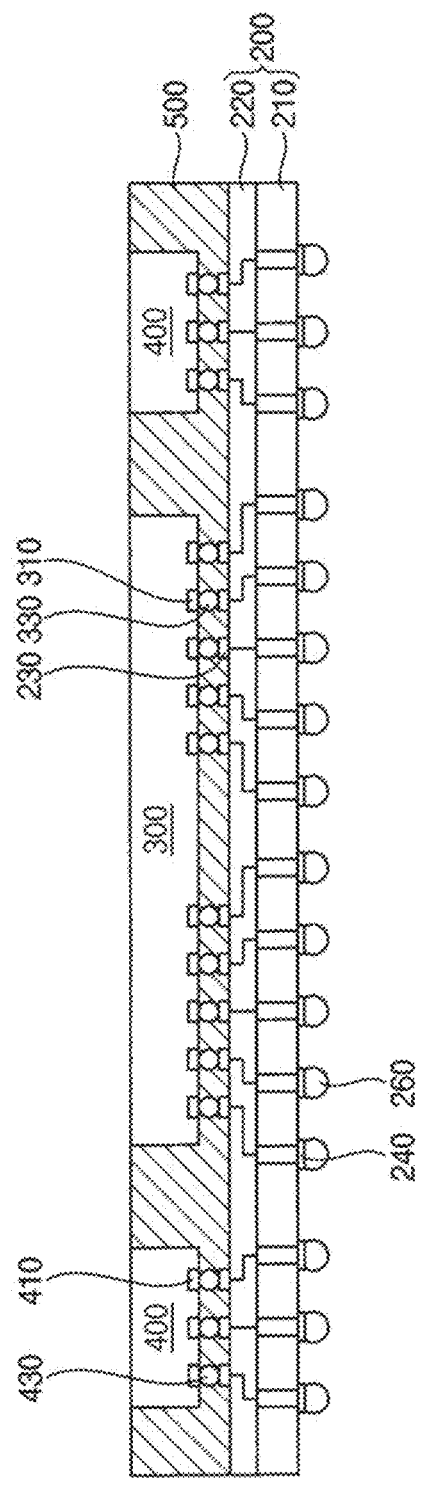
Figure 15:
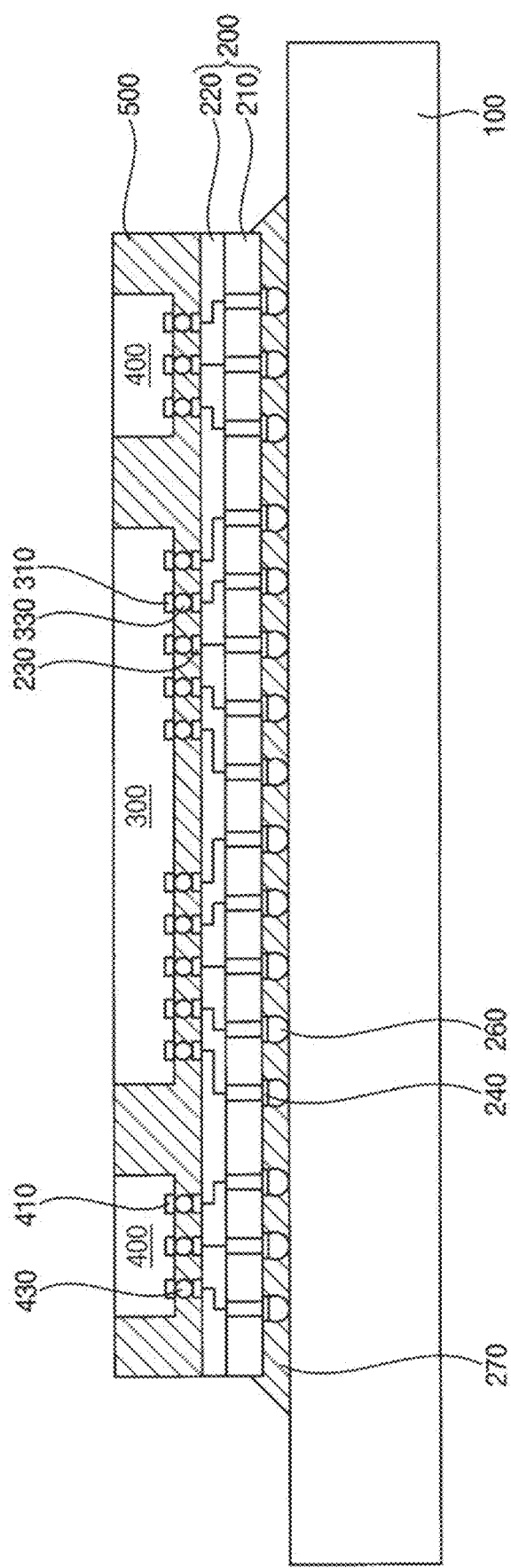

Referring to FIGS. 14 and 15, the wafer W may be cut along the cutting region CA to form the individual interposer 200, and the interposer 200 on which the first and second semiconductor devices 300, 400 are mounted may be disposed on a package substrate 100. Then, an underfill member 270 may be formed between the interposer 200 and the package substrate 100.

In example embodiments, the interposer 200 may be mounted on the package substrate 100 through the solder bumps 260. The interposer 200 may be attached on the package substrate 100 by a thermal compression process. Alternatively, the interposer 200 may be attached on the package substrate 100 by a mass reflow process.

Then, an underfill solution may be dispensed between the interposer 200 and the package substrate 100 while moving a dispenser nozzle along edges of the interposer 200, and the underfill solution may be cured to form the underfill member 270.

Then, outer connection members such as solder balls may be formed on outer connection pads on a lower surface of the package substrate 100 respectively to complete the semiconductor package 10 in FIG. 1.

Figure 16:
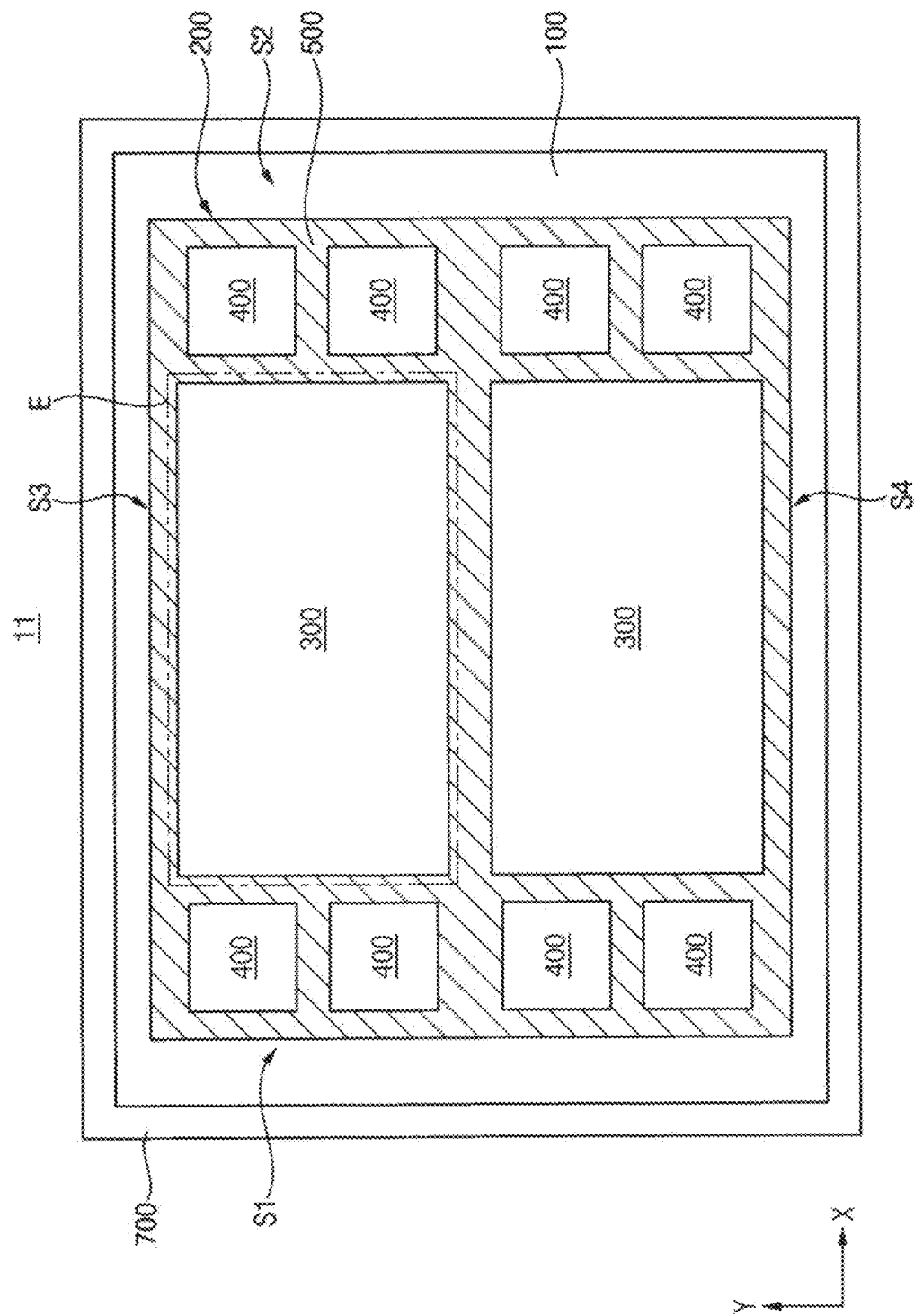
Figure 17:
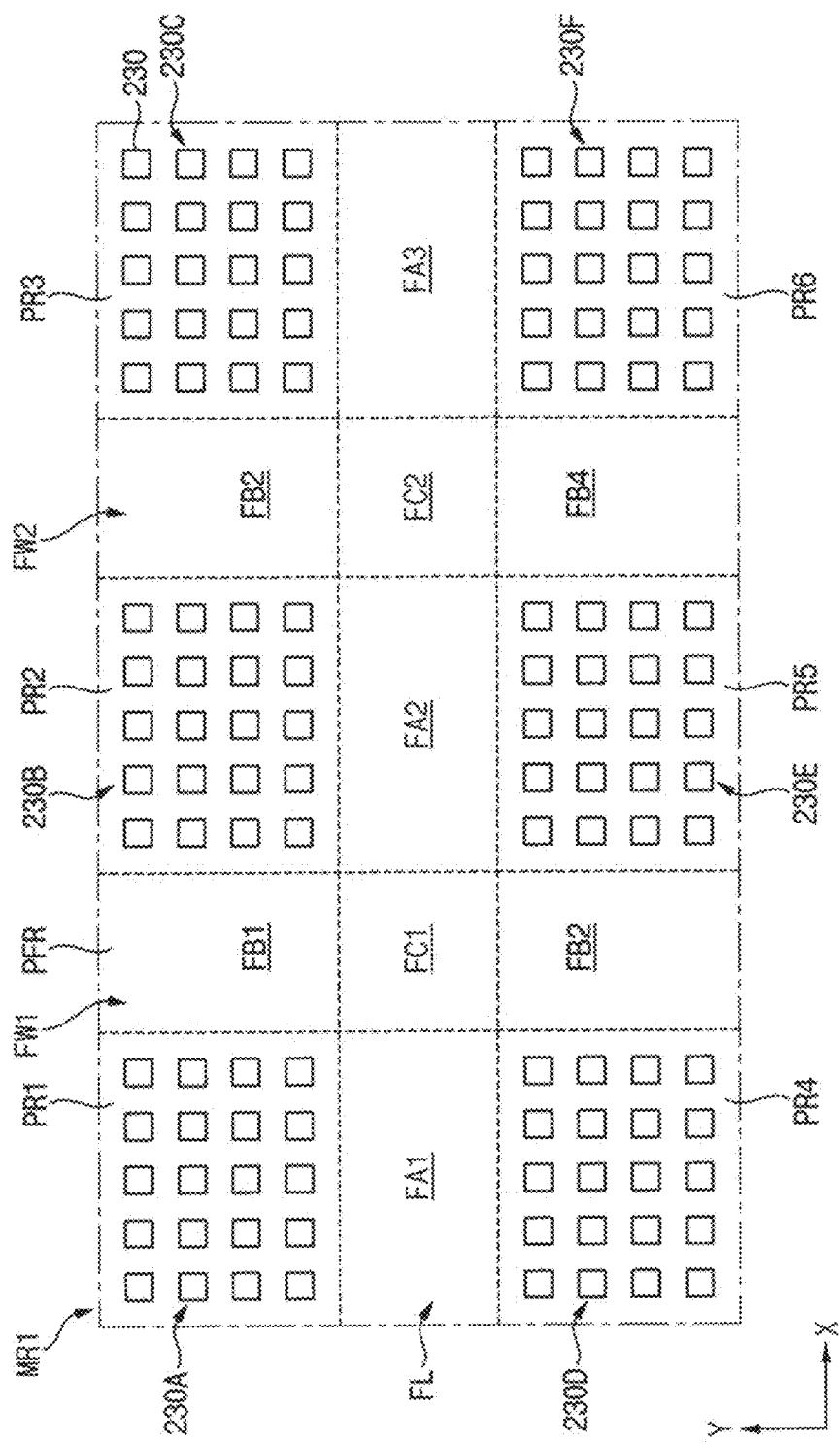

FIG. 16 is a plan view illustrating a semiconductor package in accordance with example embodiments. FIG. 17 is an enlarged plan view illustrating portion 'E' in FIG. 16. The semiconductor package may be substantially the same as or similar to the semiconductor package described with reference to FIGS. 1 to 3 except for arrangements of first and second semiconductor devices and an arrangement of first bonding pads in a first individual mounting region. Thus, same reference numerals will be used to refer to the same or like elements and any further repetitive explanation concerning the above elements will be omitted.

Referring to FIGS. 16 and 17, first and second semiconductor devices 300, 400 may be arranged on an upper surface of an interposer 200 to be spaced apart from each other. Two first semiconductor devices 300 may be arranged to be spaced apart from each other in a second direction (Y direction) with a center line of the interposer 200 interposed therebetween. The center line ML may pass through the midpoint of shot sides S1, S2 of the interposer 200. Four second semiconductor devices 400 may be spaced apart from each other in the second direction (Y direction) along a first side surface S1 of the interposer 200. The four second semiconductor devices 400 may be spaced apart from each other in the second direction (Y direction) along a second side surface S2 of the interposer 200. The two second semiconductor devices 400 may be disposed to be spaced apart from each other in the second direction (Y direction) with the center line ML of the interposer 200 interposed therebetween.

The two second semiconductor devices 400 may be arranged in the left side of the first semiconductor device 300 above the center line ML adjacent to the first side surface S1 of the interposer 200, and the two second semiconductor devices 400 may be arranged in the right side of the first semiconductor device 300 above the center line ML adjacent to the second side surface S2 of the interposer 200. Similarly, the two second semiconductor devices 400 may be arranged in the left side of the first semiconductor device 300 below the center line ML adjacent to the first side surface S1 of the interposer 200, and the two second semiconductor devices 400 may be arranged in the right side of the first semiconductor device 300 below the center line ML adjacent to the second side surface S2 of the interposer 200.

Although only two first semiconductor device 300 and eight second semiconductor device 400 are illustrated in the figures, the numbers and arrangements thereof are non-limiting examples, and it may not be limited thereto.

A plurality of individual mounting regions in which the first and second semiconductor devices 300, 400 are mounted respectively may be provided on the upper surface of the interposer 200. The first semiconductor devices 300 may be mounted in first individual mounting regions MR1 respectively, and the second semiconductor devices 400 may be mounted in second individual mounting regions respectively. The first individual mounting region MR1 may have a larger area than the second individual mounting region.

The first individual mounting region MR1 having the relatively widest area among the individual mounting regions may include a pad-free region PFR and a plurality of pad regions PR1, PR2, PR3, PR4, PR5, PR6 defined by a pad-free region PFR-free region PFR.

The pad-free region PFR may have two cross-shaped structures. The pad-free region PFR may include at least one transverse passage portion FL extending in a first direction (X direction) and two longitudinal passage portions FW1, FW2 extending in a second direction (Y direction) to intersect with the transverse passage portion FL. The transverse passage portion FL and a first longitudinal passage portion FW1 may have a first intersection portion FC1 where they cross each other in a central region of the first individual mounting region MR1. The transverse passage portion FL and a second longitudinal passage portion FW2 may have a second intersection portion FC2 where they cross each other in the central region of the first individual mounting region MR1. The second direction may be perpendicular to the first direction.

The transverse passage portion FL may include a first transverse extension portion FA1 extending from a first side portion of the first individual mounting region MR1 to the first intersection portion FC1, a second transverse extension portion FA2 extending from the first intersection portion FC1 to the second intersection portion FC2 and a third transverse extension portion FA3 extending from a second side portion opposite to the first side portion of the first individual mounting region MR1 to the second intersection portion FC2. Accordingly, the first transverse extension portion FA1, the first intersection portion FC1, the second transverse extension portion FA2, the second intersection portion FC2 and the third transverse extension portion FA3 may constitute the transverse passage portion FL.

The first longitudinal passage portion FW1 may include a first longitudinal extension portion FB1 extending from a third side portion of the first individual mounting region MR1 to the first intersection portion FC1 and a second longitudinal extension portion FB2 extending from a fourth side portion opposite to the third side portion of the first individual mounting region MR1 to the first intersection portion FC1. Accordingly, the first longitudinal extension portion FB1, the first intersection portion FC1 and the second longitudinal extension portion FB2 may constitute the first longitudinal passage portion FW1.

The second longitudinal passage portion FW2 may include a third longitudinal extension portion FB3 extending from the third side portion of the first individual mounting region MR1 to the second intersection portion FC2 and a fourth longitudinal extension portion FB4 extending from the fourth side portion of the first individual mounting region MR1 to the second intersection portion FC2. Accordingly, the third longitudinal extension portion FB3, the second intersection portion FC2 and the fourth longitudinal extension portion FB4 may constitute the second longitudinal passage portion FW2.

The first individual mounting region MR1 may include first to sixth pad regions PR1, PR2, PR3, PR4, PR5, PR6 defined by the pad-free region PFR. The first bonding pads 230 may be arranged in the first to sixth pad regions PR1, PR2, PR3, PR4, PR5, PR6, but may not be arranged in the pad-free region PFR. A first group of the first bonding pads 230A may be arranged in an array in the first pad area PR1. A second group of the first bonding pads 230B may be arranged in an array in the second pad area PR2. A third group of the first bonding pads 230C may be arranged in an array in the third pad area PR3. A fourth group of the first bonding pads 230D may be arranged in an array in the fourth pad area PR4. A fifth group of the first bonding pads 230E may be arranged in an array in the fifth pad area PR5. A sixth group of the first bonding pads 230F may be arranged in an array in the sixth pad area PR6.

The first semiconductor device 300 may be mounted on the first individual mounting region MR1 of the interposer 200 by conductive bumps as first conductive connection members. Chip pads of the first semiconductor device 300 may be electrically connected to the first bonding pads 230 of the interposer 200, which are arranged in the first to sixth pad regions PR1, PR2, PR3, PR4, PR5, PR6 of the interposer 200, by the conductive bumps.

A molding member 500 may be provided on the interposer 200 to cover outer surfaces of the first and second semiconductor devices 300, 400 and to completely fill gaps between a first surface (upper surface) of the interposer 200 and the first and second semiconductor devices 300, 400.

Since the conductive bumps are not provided in a space between the first surface of the interposer 200 and the first semiconductor device 300 above the pad-free region PFR in which the pads are not formed-free region PFR, the space above the pad-free region PFR may serve as an injection passage for a molding hardening material during a molding compression process in a wafer level for forming the molding member 500.

Thus, the small space between the interposer 200 and the first semiconductor device 300 may be effectively filled with the molding member 500 through the pad-free region PFR, to thereby prevent a void from occurring in the central region of the first individual mounting region MR1 under the first semiconductor device 300.

Figure 18:
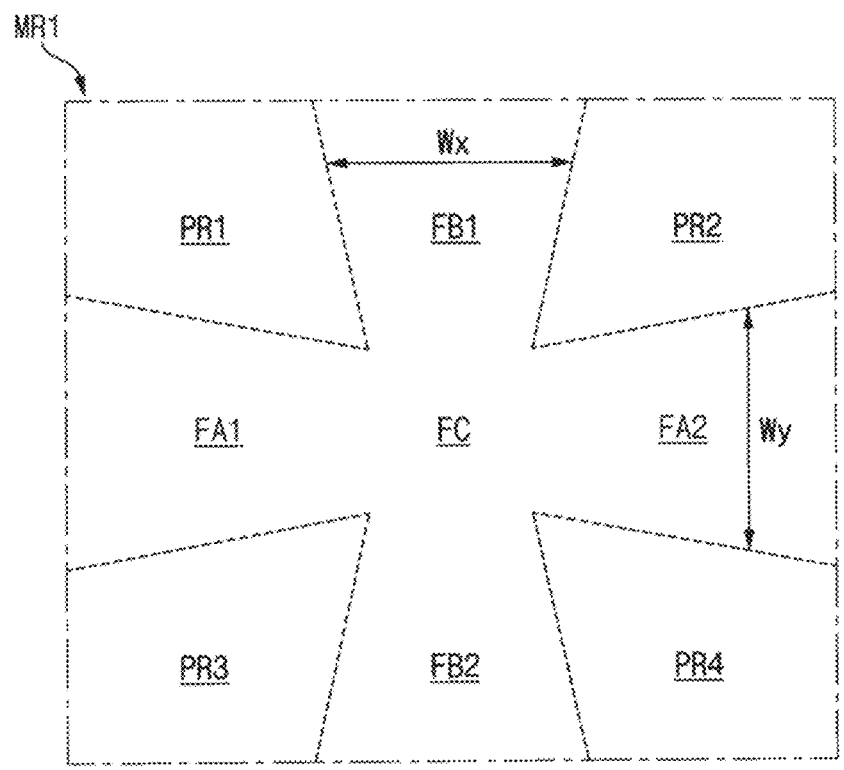

FIG. 18 is a plan view illustrating a first individual mounting region of an interposer in accordance with example embodiments.

Referring to FIG. 18, a first semiconductor device of a semiconductor package may be mounted in a first individual mounting region MR1 on a first surface of an interposer. The first individual mounting area MR1 may include a cross-shaped pad-free region and a plurality of pad regions PR1, PR2, PR3, PR4 defined by the pad-free region.

The pad-free region may include a transverse passage portion extending in a first direction and a longitudinal passage portion extending in a second direction to intersect with the transverse passage portion. The transverse passage portion and the longitudinal passage portion may have an intersection portion FC where they cross each other in a central region of the first individual mounting region MR1.

The transverse passage portion may include a first transverse extension portion FA1 extending from a first side portion of the first individual mounting region MR1 to the intersection portion FC and a second transverse extension portion FA2 extending from a second side portion opposite to the first side portion of the first individual mounting region MR1 to the intersection portion FC. Accordingly, the first transverse extension portion FA1, the intersection portion FC and the second transverse extension portion FA2 may constitute the transverse passage portion.

The longitudinal passage portion may include a first longitudinal extension portion FB1 extending from a third side portion of the first individual mounting region MR1 adjacent to the first side portion to the intersection portion FC and a second longitudinal extension portion FB2 extending from a fourth side portion opposite to the third side portion of the first individual mounting region MR1 to the intersection portion FC. Accordingly, the first longitudinal extension portion FB1, the intersection portion FC and the second longitudinal extension portion FB2 may constitute the longitudinal passage portion FL.

In example embodiments, a first width Wy of the transverse passage portion and a second width Wy of the longitudinal passage portion may vary along an extension direction thereof.

The first width Wy of the transverse passage portion may gradually decrease toward the central region of the first individual mounting region MR1. A width of the first transverse extension portion FA1 may gradually decrease as it approaches the intersection portion FC. A width of the second transverse extension portion FA2 may gradually decrease as it approaches the intersection portion FC.

The second width Wy of the longitudinal passage portion may gradually decrease toward the central region of the first individual mounting region MR1. A width of the first longitudinal extension portion FB1 may gradually decrease as it approaches the intersection portion FC. A width of the second longitudinal extension portion FB2 may gradually decrease as it approaches the intersection portion FC.

Figure 19:
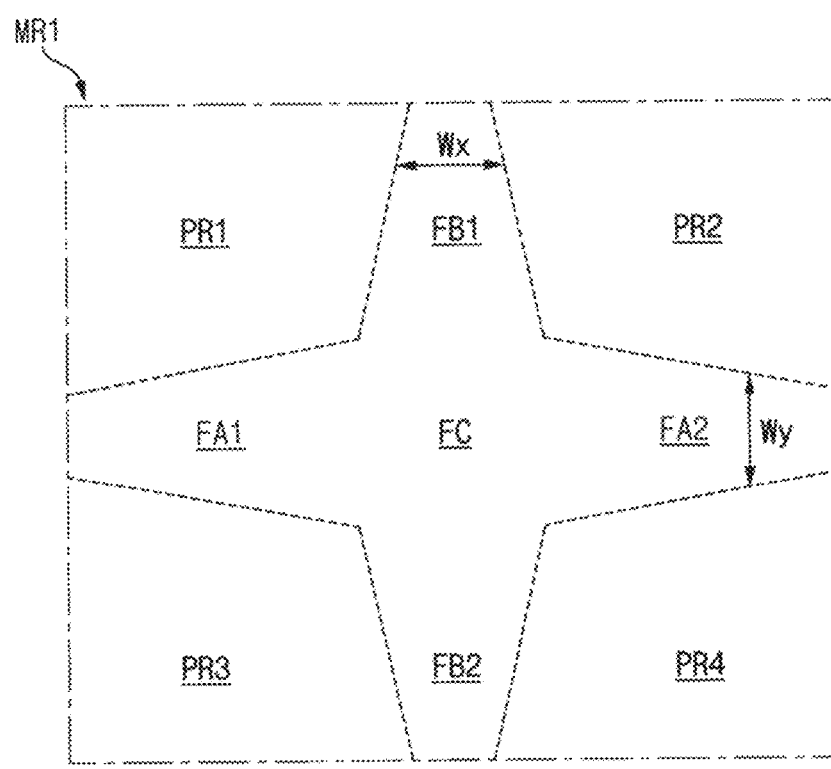

FIG. 19 is a plan view illustrating a first individual mounting region of an interposer in accordance with example embodiments.

Referring to FIG. 19, a pad-free region may include a transverse passage portion extending in a first direction and a longitudinal passage portion extending in a second direction to intersect with the transverse passage portion. The transverse passage portion and the longitudinal passage portion may have an intersection portion FC where they cross each other in a central region of the first individual mounting region MR1.

In example embodiments, a first width Wy of the transverse passage portion may gradually increase toward the central region of the first individual mounting region MR1. A width of a first transverse extension portion FA1 may gradually increase as it approaches the intersection portion FC. A width of a second transverse extension portion FA2 may gradually increase as it approaches the intersection portion FC.

A second width Wy of the longitudinal passage portion may gradually increase toward the central region of the first individual mounting region MR1. A width of a first longitudinal extension portion FB1 may gradually increase as it approaches the intersection portion FC. A width of a second longitudinal extension portion FB2 may gradually increase as it approaches the intersection portion FC.

Figure 20:
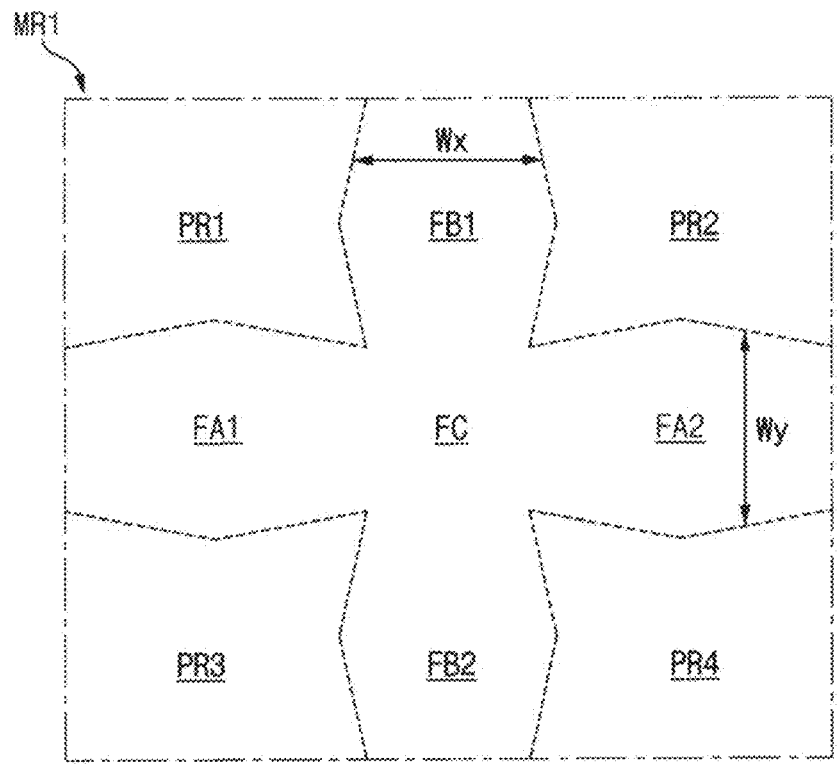

FIG. 20 is a plan view illustrating a first individual mounting region of an interposer in accordance with example embodiments.

Referring to FIG. 20, a first width Wy of a transverse passage portion may gradually increase and then decrease toward a central region of a first individual mounting region MR1. A width of a first transverse extension portion FA1 may gradually increase and then decrease as it approaches an intersection portion FC. A width of a second transverse extension portion FA2 may gradually increase and then decrease as it approaches the intersection portion FC.

A second width Wy of the longitudinal passage portion may gradually increase and then decrease toward the central region of the first individual mounting region MR1. A width of a first vertical extension portion FB1 may gradually increase and then decrease as it approaches the intersection portion FC. A width of a second vertical extension portion FB2 may gradually increase and then decrease as it approaches the intersection portion FC.

Figure 21:
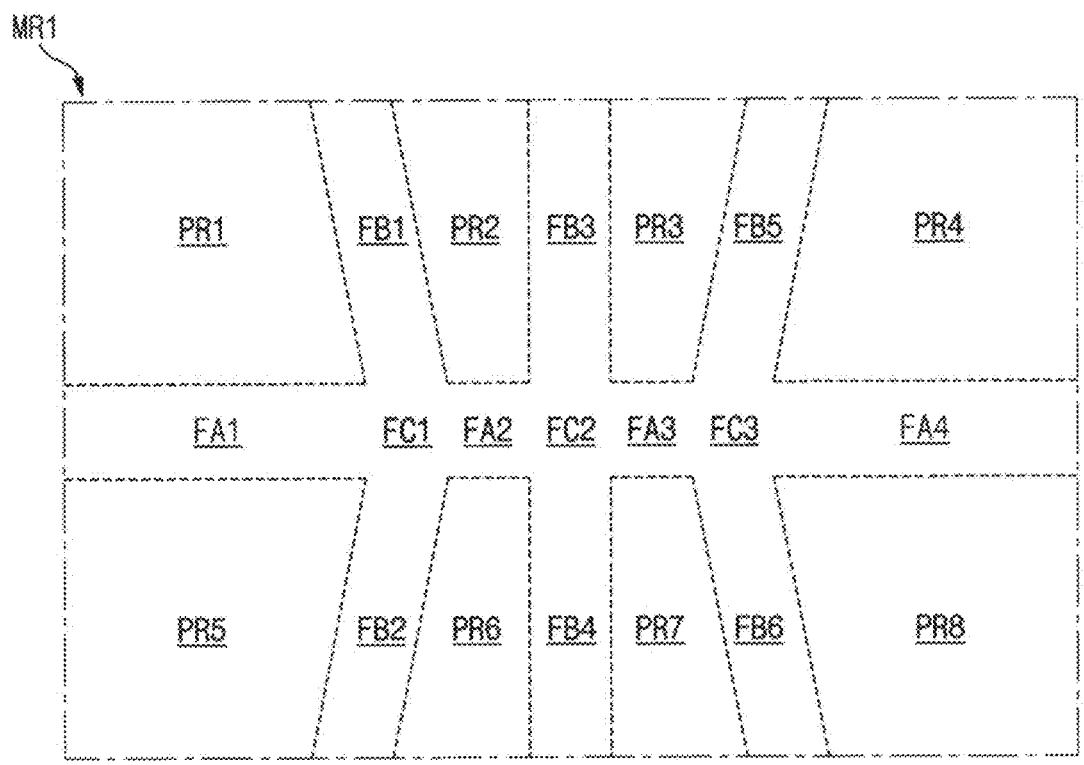

FIG. 21 is a plan view illustrating a first individual mounting region of an interposer in accordance with example embodiments.

Referring to FIG. 21, a pad-free region of a first individual mounting region may have three cross-shaped structures. The pad-free region PFR may include one transverse passage portion extending in a first direction and three longitudinal passage portions extending in a second direction to intersect with the transverse passage portion. The transverse passage portion and three longitudinal passage portions may cross each other in a central region of the first individual mounting region MR1 to form first to third intersection portions FC1, FC2, FC3.

The transverse passage portion may include a first transverse extension portion FA1 extending from a first side portion of the first individual mounting region MR1 to the first intersection portion FC1, a second transverse extension portion FA2 extending from the first intersection portion FC1 to the second intersection portion FC2, a third transverse extension portion FA3 extending from the second intersection portion FC2 to the third intersection portion FC3 and a fourth transverse extension portion FA4 extending from a second side portion opposite to the first side portion of the first individual mounting region MR1 to the third intersection portion FC2. Accordingly, the first transverse extension portion FA1, the first intersection portion FC1, the second transverse extension portion FA2, the second intersection portion FC2, the third transverse extension portion FA3 and the fourth transverse extension portion FA4 may constitute the transverse passage portion.

The first longitudinal passage portion may include a first longitudinal extension portion FB1 extending from a third side portion of the first individual mounting region MR1 to the first intersection portion FC1 and a second longitudinal extension portion FB2 extending from a fourth side portion opposite to the third side portion of the first individual mounting region MR1 to the first intersection portion FC1. Accordingly, the first longitudinal extension portion FB1, the first intersection portion FC1 and the second longitudinal extension portion FB2 may constitute the first longitudinal passage portion.

The second longitudinal passage portion may include a third longitudinal extension portion FB3 extending from the third side portion of the first individual mounting region MR1 to the second intersection portion FC2 and a fourth longitudinal extension portion FB4 extending from the fourth side portion of the first individual mounting region MR1 to the second intersection portion FC2. Accordingly, the third longitudinal extension portion FB3, the second intersection portion FC2 and the fourth longitudinal extension portion FB4 may constitute the second longitudinal passage portion.

The third longitudinal passage portion may include a fifth longitudinal extension portion FB5 extending from the third side portion of the first individual mounting region MR1 to the third intersection portion FC3 and a sixth longitudinal extension portion FB6 extending from the fourth side portion of the first individual mounting region MR1 to the third intersection portion FC3. Accordingly, the fifth longitudinal extension portion FB5, the third intersection portion FC3 and the sixth longitudinal extension portion FB6 may constitute the third longitudinal passage portion.

The first individual mounting region MR1 may include first to eighth pad regions PR1, PR2, PR3, PR4, PR5, PR6, PR7, PR8 defined by the pad-free region PFR. First bonding pads of an interposer may be arranged in the first to eighth pad regions PR1, PR2, PR3, PR4, PR5, PR6, PR7, PR8, and may not be arranged in the pad-free region.

In example embodiments, the transverse passage portion and the longitudinal passage portion may intersect at a desired and/or alternatively predetermined angle. An angle between an extending direction of the transverse passage portion and an extending direction of the longitudinal passage portion may be within a range of 75 degrees to 85 degrees.

A first transverse extension portion FA1 and a first longitudinal extension portion FB1 may cross each other to form an acute angle. A second transverse extension portion FA2 and the first longitudinal extension portion FB1 may cross each other to form an obtuse angle. The first transverse extension portion FA1 and a second longitudinal extension portion FB2 may cross each other to form an acute angle. The second transverse extension portion FA2 and the second longitudinal extension portion FB2 may cross each other to form an obtuse angle.

Symmetrically, a fourth transverse extension portion FA4 and a fifth longitudinal extension portion FB5 may cross each other to form an acute angle. A third transverse extension portion FA3 and the fifth longitudinal extension portion FB5 may cross each other to form an obtuse angle. The fifth transverse extension portion FA5 and a sixth longitudinal extension portion FB6 may cross each other to form an acute angle. The third transverse extension portion FA3 and the sixth longitudinal extension portion FB6 may cross each other to form an obtuse angle.

The second transverse extension portion FA2 and a third longitudinal extension portion FB3 may cross each other to form a right angle. The second transverse extension portion FA2 and a fourth longitudinal extension portion FB4 may cross each other to form a right angle. The third transverse extension portion FA3 and the third second longitudinal extension portion FB3 may cross each other to form a right angle. The third transverse extension portion FA3 and the fourth longitudinal extension portion FB4 may cross each other to form a right angle.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like. The HBM devices may comply with a High Bandwidth Memory (HBM) standard released by JEDEC (Joint Electron Device Engineering Council), as well as future evolutions/versions of HBM standards.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of embodiments of inventive concepts. Accordingly, all such modifications are intended to be included within the scope of example embodiments as defined in the claims.

What is claimed is:

1. A semiconductor package, comprising:
    a package substrate;
    an interposer on the package substrate, the interposer including individual mounting regions on a first surface thereof and a plurality of first bonding pads in the individual mounting regions respectively;
    a plurality of semiconductor devices in the individual mounting regions on the first surface of the interposer, respectively, the plurality of semiconductor devices each having chip pads electrically connected to the plurality of first bonding pads;
    first conductive connection members between the plurality of first bonding pads and the chip pads; and
    a molding member on the interposer, the molding member covering the plurality of semiconductor devices and filling gaps between the first surface of the interposer and the plurality of semiconductor devices, the molding member directly contacting the first surface of the interposer and a bottom surface of the plurality of semiconductor devices,
    wherein at least one of the individual mounting regions includes a pad-free region with a cross shape and a plurality of pad regions defined by the pad-free region, and the plurality of first bonding pads are in the plurality of pad regions.

2. The semiconductor package of claim 1, wherein the pad-free region comprises:
    at least one transverse passage portion extending in a first direction; and
    at least one longitudinal passage portion extending in a second direction to intersect with the at least one transverse passage portion.

3. The semiconductor package of claim 1, wherein, in a corresponding individual mounting region among the at least one of the individual mounting regions,
    the pad-free region comprises a transverse passage portion extending in a first direction and a longitudinal passage portion extending in a second direction to intersect with the transverse passage portion, and
    the transverse passage portion and the longitudinal passage portion cross each other in a central region of the corresponding individual mounting region to form an intersection portion.

4. The semiconductor package of claim 3, wherein, in the corresponding individual mounting region,
    the transverse passage portion includes a first transverse extension portion and a second transverse extension portion,
    the first transverse extension portion extends from a first side portion of the corresponding individual mounting region to the intersection portion,
    the second transverse extension portion extends from a second side portion of the corresponding individual mounting region to the intersection portion, and
    the first side portion is opposite the second side portion.

5. The semiconductor package of claim 3, wherein
    in the corresponding individual mounting region,
    the longitudinal passage portion includes a first longitudinal extension portion and a second longitudinal extension portion,
    the first longitudinal extension portion extends from a third side portion of the corresponding individual mounting region to the intersection portion, and
    the second longitudinal extension portion extends from a fourth side portion of the corresponding individual mounting region to the intersection portion, and
    the fourth side portion is opposite the third side portion.

6. The semiconductor package of claim 2, wherein widths of the transverse passage portion and the longitudinal passage portion vary along extension directions thereof.

7. The semiconductor package of claim 1, wherein a width of the pad-free region is at least three times a pitch between the first bonding pads.

8. The semiconductor package of claim 1, wherein the molding member exposes upper surfaces of the plurality of semiconductor devices.

9. The semiconductor package of claim 1, further comprising:
a plurality of second conductive connection members, wherein
the package substrate includes substrate pads,
the interposer includes second bonding pads on a second surface of the interposer,
the plurality of second conductive connection members are between the second bonding pads of the interposer and the substrate pads of the package substrate, wherein
the second surface of the interposer is opposite the first surface of the interposer.

10. The semiconductor package of claim 1, further comprising:
an underfill member between the interposer and the package substrate.

11. A semiconductor package, comprising:
a package substrate;
an interposer on the package substrate, the interposer including a plurality of first bonding pads on a first surface of the interposer and a plurality of second bonding pads on a second surface of the interposer, the first surface of the interposer and the second surface of the interposer being opposite each other, the plurality of first bonding pads being in individual mounting regions on the first surface of the interposer, respectively;
a plurality of semiconductor devices in the individual mounting regions on the first surface of the interposer, respectively, each of the plurality of semiconductor devices having chip pads electrically connected to the plurality of first bonding pads by a plurality of first conductive connection members; and
a molding member on the first surface of the interposer, the molding member covering the plurality of semiconductor devices and filling gaps between the first surface of the interposer and the plurality of semiconductor devices, the molding member directly contacting the first surface of the interposer and a bottom surface of the plurality of semiconductor devices, wherein
at least one of the individual mounting regions includes a pad-free region,
the pad-free region has a transverse passage portion and a longitudinal passage portion crossing each other and a plurality of pad regions defined by the pad-free region,
the plurality of first bonding pads are in the plurality of pad regions,
the plurality of first bonding pads are not arranged in the pad-free region, and
a width of the pad-free region is at least three times a pitch between the plurality of first bonding pads.

12. The semiconductor package of claim 11, wherein
the transverse passage portion and the longitudinal passage portion cross each other in a central region of the at least one of the individual mounting regions to form an intersection portion.

13. The semiconductor package of claim 12, wherein, in a corresponding individual mounting region among the at least one of the individual mounting regions,
the transverse passage portion includes a first transverse extension portion and a second transverse extension portion,
the first transverse extension portion extends from a first side portion of the corresponding individual mounting region to the intersection portion,
the second transverse extension portion extends from a second side portion of the corresponding individual mounting region to the intersection portion, and
the first side portion is opposite the second side portion.

14. The semiconductor package of claim 12, wherein, in a corresponding individual mounting region among the at least one of the individual mounting regions,
the longitudinal passage portion includes a first longitudinal extension portion and a second longitudinal extension portion,
the first longitudinal extension portion extends from a third side portion of the individual mounting region to the intersection portion,
the second longitudinal extension portion extends from a fourth side portion of the corresponding individual mounting region to the intersection portion, and
the fourth side portion is opposite the third side portion.

15. The semiconductor package of claim 11, wherein widths of the transverse passage portion and the longitudinal passage portion vary along extension directions thereof.

16. The semiconductor package of claim 11, wherein the transverse passage portion and the longitudinal passage portion intersect at an angle.

17. The semiconductor package of claim 11, wherein the molding member exposes upper surfaces of the semiconductor devices.

18. The semiconductor package of claim 11, further comprising:
a plurality of second conductive connection members, wherein
the package substrate includes substrate pads, and
the plurality of second conductive connection members are between the second bonding pads of the interposer and the substrate pads of the package substrate.

19. The semiconductor package of claim 11, further comprising:
an underfill member between the interposer and the package substrate.

20. A semiconductor package, comprising:
a package substrate including substrate pads;
an interposer on the package substrate, the interposer having a plurality of first bonding pads on a first surface of the interposer and a plurality of second bonding pads on a second surface of the interposer, the first surface of the interposer and the second surface of the interposer being opposite each other, the plurality of first bonding pads being in individual mounting regions on the first surface of interposer, respectively;
a plurality of semiconductor devices in the individual mounting regions on the first surface of the interposer, respectively, each of the plurality of semiconductor devices having chip pads electrically connected to the plurality of first bonding pads by a plurality of first conductive connection members;
a molding member on the first surface of the interposer, the molding member covering the plurality of semiconductor devices and filling gaps between the first surface of the interposer and the plurality of semiconductor devices, the molding member directly contacting the first surface of the interposer and a bottom surface of the plurality of semiconductor devices;

a plurality of second conductive connection members between the plurality of second bonding pads of the interposer and the substrate pads of the package substrate; and an underfill member between the interposer and the package substrate, wherein at least one of the individual mounting regions includes a pad-free region, the pad-free region has a transverse passage portion and a longitudinal passage portion crossing each other and a plurality of pad regions defined by the pad-free region, the first bonding pads are in the plurality of pad regions, the first bonding pads are not arranged in the pad-free region, a width of the pad-free region is at least three times a pitch between the plurality of first bonding pads, and the at least one of the individual mounting regions has an area of 11 mm×11 mm or more.

* * * * *